US012787370B2

(12) United States Patent
Lin et al.

(10) Patent No.: US 12,787,370 B2
(45) Date of Patent: Nov. 3, 2026

(54) SEMICONDUCTOR DEVICE AND METHOD FOR FORMING THE SAME

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Shih-Yen Lin, New Taipei City (TW); Po-Cheng Tsai, Taichung City (TW); Che-Jia Chang, Taichung City (TW)

(73) Assignees: TAIWAN SEMICONDUCTOR MANUFACTURING COMPANY, LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 475 days.

(21) Appl. No.: 18/352,833

(22) Filed: Jul. 14, 2023

(65) Prior Publication Data

US 2025/0022943 A1 Jan. 16, 2025

(51) Int. Cl.

| | |
|---|---|
| ***H01L 29/76*** | (2006.01) |
| ***H10D 30/67*** | (2025.01) |
| ***H10D 48/36*** | (2025.01) |
| ***H10D 62/80*** | (2025.01) |
| ***H10D 99/00*** | (2025.01) |
| ***H10P 14/20*** | (2026.01) |

(52) U.S. Cl.

CPC ....... *H10D 48/362* (2025.01); *H10D 30/6757* (2025.01); *H10D 62/80* (2025.01); *H10D 99/00* (2025.01); *H10P 14/3436* (2026.01)

(58) Field of Classification Search

CPC ..... H10D 48/362; H10D 99/00; H10F 30/282

See application file for complete search history.

(56) References Cited

U.S. PATENT DOCUMENTS

| | | | | |
|---|---|---|---|---|
| 11,189,736 | B2 * | 11/2021 | Yamazaki | H10F 39/80377 |
| 11,569,367 | B1 * | 1/2023 | Son | H10D 62/8303 |
| 12,513,946 | B2 * | 12/2025 | Lin | H10D 30/6757 |
| 2020/0098564 | A1 * | 3/2020 | Li | H01L 21/02381 |
| 2020/0098887 | A1 * | 3/2020 | Dewey | H10D 84/83 |
| 2020/0098932 | A1 * | 3/2020 | Lajoie | H10D 30/6746 |

(Continued)

OTHER PUBLICATIONS

Chen et al., "Single-Crystal Antimonene Films Prepared by Molecular Beam Epitaxy: Selective Growth and Contact Resistance Reduction of the 2D Material Heterostructure", ACS Appl. Mater. Interfaces, 2018, vol. 10, No. 17, pp. 15058-15064.

(Continued)

*Primary Examiner* — Thao P Le

(74) *Attorney, Agent, or Firm* — Birch, Stewart, Kolasch & Birch, LLP

(57) ABSTRACT

A semiconductor device includes a 2-D material channel layer, a gate structure, and source/drain electrodes. The gate structure is over a channel region of the 2-D material channel layer. The source/drain electrodes are over source/drain regions of the 2-D material channel layer, respectively. Each of the source/drain electrodes includes a 2-D material electrode and a metal electrode. The 2-D material electrode is below a bottom surface of a corresponding one of the source/drain regions of the 2-D material channel layer. The metal electrode is over a top surface of the corresponding one of the source/drain regions of the 2-D material channel layer.

20 Claims, 24 Drawing Sheets

(56) References Cited

U.S. PATENT DOCUMENTS

| | | | | |
|---|---|---|---|---|
| 2023/0103876 | A1 * | 4/2023 | Yoo | H10D 48/362<br>257/29 |
| 2024/0136461 | A1 * | 4/2024 | Miao | H10F 77/206 |
| 2024/0371944 | A1 * | 11/2024 | Lin | H10D 84/0158 |
| 2025/0048751 | A1 * | 2/2025 | Romagnoli | H10F 77/206 |
| 2025/0159956 | A1 * | 5/2025 | Chuu | H10D 30/6757 |

OTHER PUBLICATIONS

Tsai et al., "Charge Storage of Isolated Monolayer Molybdenum Disulfide in Epitaxially Grown MoS2/Graphene Heterostructures for Memory Device Applications", ACS Appl. Mater. Interfaces, Sep. 2021, vol. 13, No. 38, pp. 45864-45869.
Tsai et al., "The Influence of Contact Metals on Epitaxially Grown Molybdenum Disulfide for Electrical and Optical Device Applications", Nanotechnology, 2022, vol. 33, No. 50, pp. 1-6.

* cited by examiner

SEMICONDUCTOR DEVICE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
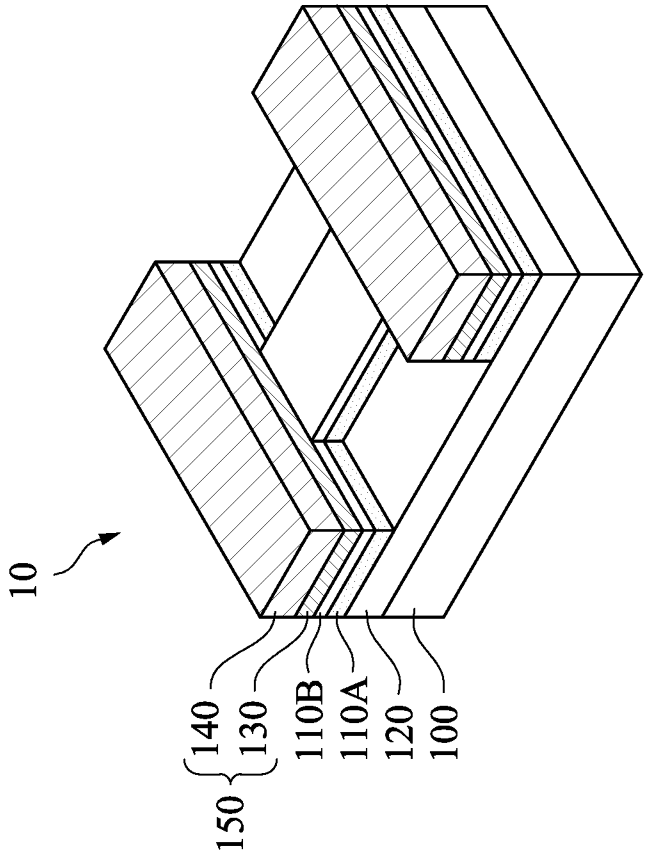
FIG. 1 illustrates a schematic view of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
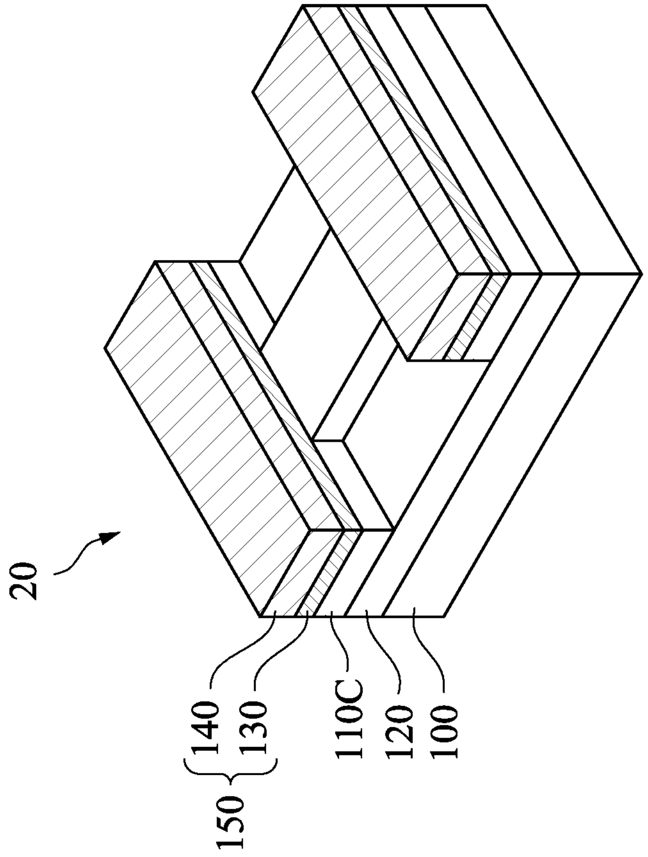
FIG. 2 illustrates a schematic view of a semiconductor device in accordance with some embodiments.

FIG. 1 illustrates a schematic view of a semiconductor device in accordance with some embodiments. FIG. 2 illustrates a schematic view of a semiconductor device in accordance with some embodiments. In greater detail, FIGS. 1 and 2 illustrate a semiconductor device 10 and a semiconductor device 20, respectively. Some elements of the semiconductor devices 10 and 20 are the same, and such elements are labeled the same for brevity.

The semiconductor devices 10 and 20 include a substrate 100. In some embodiments, the substrate 100 may be a conductive substrate, such as polysilicon. For example, the substrate 100 may be made of p-doped polysilicon. The semiconductor devices 10 and 20 include a dielectric layer 120 over the substrate 100. In some embodiments, the dielectric layer 120 is silicon dioxide (e.g., $SiO_2$) or aluminum oxide ($Al_2O_3$), while in other embodiments the dielectric layer 120 may be a high-k dielectric. In some embodiments, the substrate 100 may serve as a gate electrode and the dielectric layer 120 may act a gate dielectric layer. Accordingly, the conductive substrate 100 can also be referred to as a gate electrode, and the dielectric layer 120 can also be referred to as a gate dielectric layer. In some embodiments, the dielectric layer 120 and the substrate 100 can be collectively referred to as a gate structure.

In FIG. 1, the semiconductor device 10 includes a 2-D material layer 110A over the dielectric layer 120 and a 2-D material layer 110B over the 2-D material layer 110A. In FIG. 2, the semiconductor device 20 includes a 2-D material layer 110C over the dielectric layer 120. As used herein, consistent with the accepted definition within solid state material art, a "2-D material" may refer to a crystalline material consisting of a single layer of atoms. As widely accepted in the art, "2-D material" may also be referred to as a "monolayer" material. In this content, "2-D material" and "monolayer" material are used interchangeably without differentiation in meanings, unless specifically pointed out otherwise. The 2-D material layer may be 2-D materials of suitable thickness. In some embodiments, a 2-D material includes a single layer of atoms in each of its monolayer structure, so the thickness of the 2-D material refers to a number of monolayers of the 2-D material, which can be one monolayer or more than one monolayer. The coupling between two adjacent monolayers of 2-D material includes van der Waals forces, which are weaker than the chemical bonds between/among atoms within the single monolayer. In some embodiments, the 2-D material layer may be a single monolayer structure, or may also be a multi-layer structure.

In some embodiments, the 2-D material layers 110B and 110C may be made of transition metal dichalcogenides (TMDs). That is, the 2-D material layers 110B and 110C are metal-containing 2-D material layers. In some embodiment where the 2-D material layers 110B and 110C include TMDs monolayers, the TMDs monolayers include molybdenum disulfide ($MoS_2$), molybdenum diselenide ($MoSe_2$) molybdenum ditelluride ($MoTe_2$), tungsten disulfide ($WS_2$), tungsten diselenide ($WSe_2$), tungsten ditelluride ($WTe_2$), or the like. On the other hand, the 2-D material layer 110A may be made of graphene. That is, the 2-D material layer 110A is a metal-free 2-D material layer.

Figure 3B:
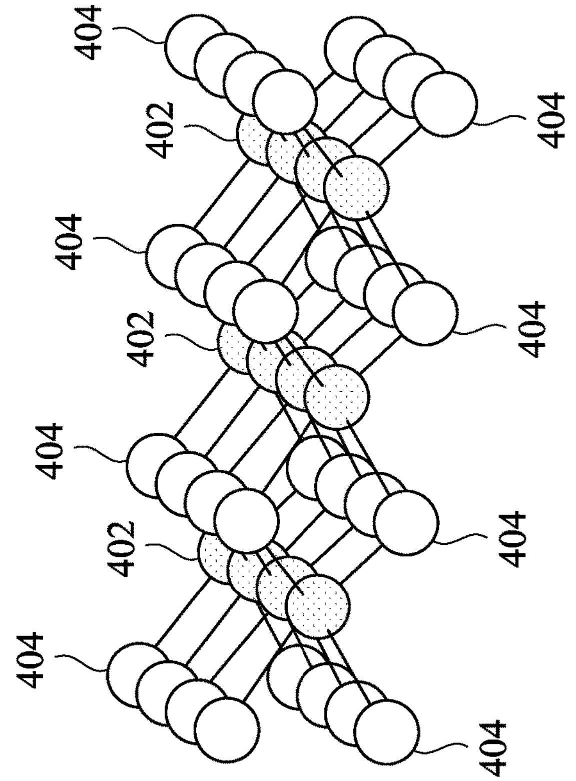
FIG. 3B illustrates a schematic view of a mono-layer of a TMD in accordance with some embodiments of the present disclosure.
Figure 3A:
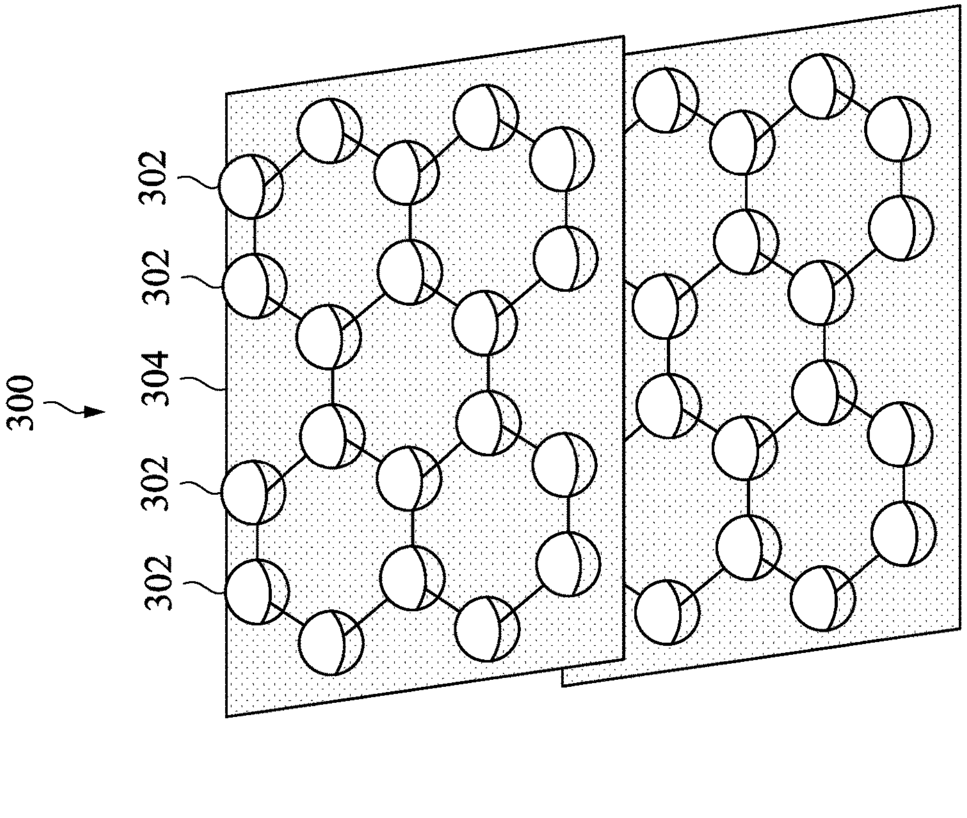
FIG. 3A illustrates a molecular diagram of graphene in accordance with some embodiments of the present disclosure.

Referring to FIG. 3A. FIG. 3A illustrates a molecular diagram 300 of graphene according to some embodiments of the present disclosure. Graphene is an arrangement of carbon atoms 302 in mono-layers aligned along a single plane 304. As pure graphene has a high conductivity, it may be doped with one or more impurities to control mobility and induce a semiconductor-like response to a gate voltage. In various embodiments, the graphene may be doped with titanium, chromium, iron, $NH_3$, potassium, and/or $NO_2$.

Referring to FIG. 3B. FIG. 3B illustrates a schematic view of a mono-layer 400 of an example TMDs in accordance with some example embodiments. In FIG. 3B, the one-molecule thick TMDs material layer includes transition metal atoms 402 and chalcogen atoms 404. The transition metal atoms 402 may form a layer in a middle region of the one-molecule thick TMDs material layer, and the chalcogen atoms 404 may form a first layer over the layer of transition metal atoms 402, and a second layer underlying the layer of transition metal atoms 402. The transition metal atoms 402 may be W atoms or Mo atoms, while the chalcogen atoms 404 may be S atoms, Se atoms, or Te atoms. Throughout the description, the illustrated cross-bonded layers including one layer of transition metal atoms 402 and two layers of chalcogen atoms 404 in combination are referred to as a mono-layer 400 of TMDs.

Referring back to FIGS. 1 and 2, the semiconductor devices 10 and 20 further include source/drain electrodes 150. In some embodiments, each of the source/drain electrodes 150 includes a first electrode layer 130 and a second electrode layer 140 over the first electrode layer 130. In some embodiments, the first electrode layer 130 and the second electrode layer 140 are made of different materials. For example, the first electrode layer 130 may be made of titanium (Ti), and the second electrode layer 140 is made of gold (Au). In other embodiments, the first electrode layer 130 is made of antimonene. Specifically, antimonene is 2-D allotrope of antimony (Sb).

In FIG. 1, the semiconductor device 10 may serve as a phototransistor. In greater detail, the 2-D material layer 110A (e.g., graphene) may serve as a channel layer of the semiconductor device 10, and the 2-D material layer 110B (e.g., TMDs) may serve as a light absorption layer of the semiconductor device 10. This is because graphene is a zero bandgap material, while TMDs, such as $MoS_2$ or $WS_2$, has direct bandgap, which makes TMDs a possible candidate for a phototransistor.

On the other hand, in FIG. 2, the semiconductor device 20 may also serve as a phototransistor. However, because only a single 2-D material layer 110C is present in the semiconductor device 20, the 2-D material layer 110C of the semiconductor device 20 (e.g., graphene) may serve as both channel layer and light absorption layer of the semiconductor device 20.

FIGS. 4 to 7 show experiment results of semiconductor devices in accordance with some embodiments of the present disclosure.

Figure 4:
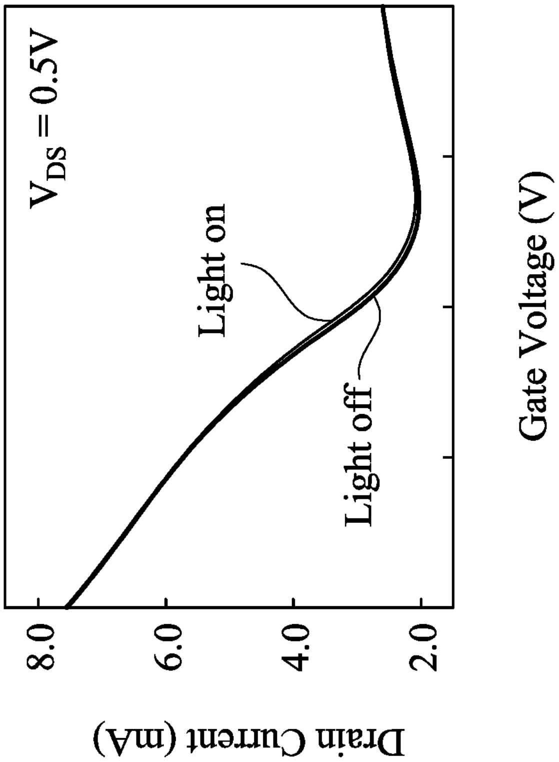
FIGS. 4 to 7 show experiment results of semiconductor devices in accordance with some embodiments of the present disclosure.

Reference is made to FIG. 4. FIG. 4 shows experiment results of the semiconductor device 10 as shown in FIG. 1. In such case, a graphene layer is used as the 2-D material layer 110A of the semiconductor device 10, and $MoS_2$ layer is used as the 2-D material layer 110B of the semiconductor device 10. In greater detail, the graphene layer serves as a channel layer (carrier transport layer), and the $MoS_2$ layer serves as a light absorption layer. Titanium (Ti) with 20 nm is used as the first electrode layer 130 of the source/drain electrode 150, and gold (Au) with 100 nm is used as the second electrode layer 140 of the source/drain electrode 150. The channel width and channel length of the semiconductor device 10 are 150 μm and 5 μm, respectively. FIG. 4 shows the transfer curves of the $MoS_2$/graphene transistor at $V_{DS}$=0.5 V with the white light source equipped with the optical microscope turned on and off. The results show that the device under irradiation and dark condition (non-irradiation) has similar transfer curves. This suggests that the photocurrents extracted from the $MoS_2$ layer (e.g., light absorption layer) are low under the light irradiation. The results also imply that the major carrier transportation of the transfer curves of FIG. 4 comes from the graphene layer.

Figure 5:
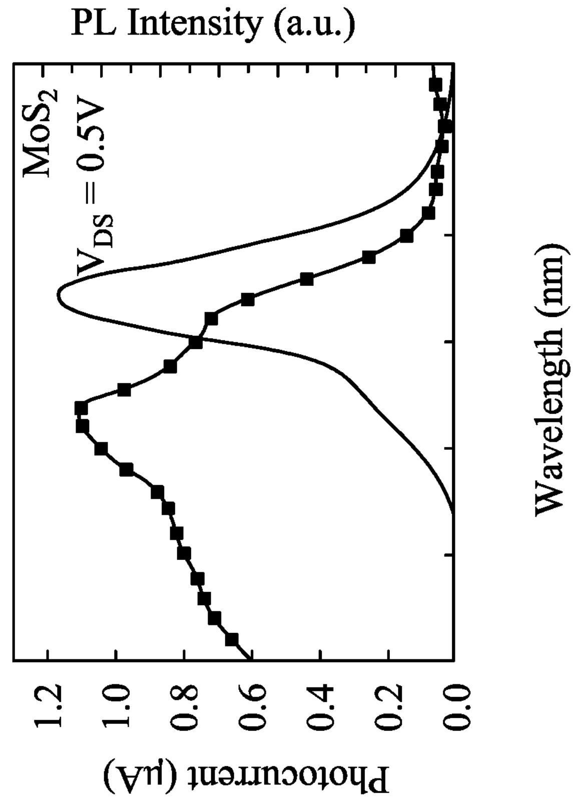

FIG. 5 shows experiment results of the semiconductor device 10 as shown in FIG. 1. The photo-current values of the $MoS_2$/graphene device under the light irradiation of different wavelengths at $V_{GS}$=0.0 V and $V_{DS}$=0.5 V are shown in FIG. 5. For comparison, the PL spectrum of the mono-layer $MoS_2$ film transferred to the graphene surface is also shown in the FIG. 5. The device parameters of FIG. 5 are similar to those described in FIG. 4, and thus relevant details will not be repeated for brevity.

Figure 6:
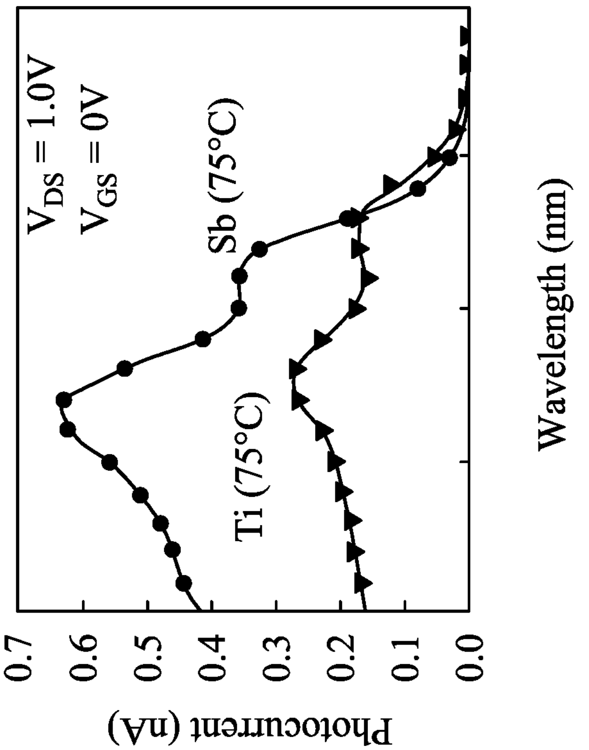

FIG. 6 shows experiment results of the semiconductor device 20 as shown in FIG. 2. In such case, $MoS_2$ layer is used as the 2-D material layer 110C of the semiconductor device 20. The experiment results of FIG. 6 show two different conditions. In one embodiment antimonene (Sb) is used as the first electrode layer 130 of the semiconductor 20, while in another embodiment titanium (Ti) is used as the first electrode layer 130 of the semiconductor 20.

In FIG. 5. it can be seen that the photocurrent values are in the order of μA, which is 3-4 orders lower than the drain current values shown in FIG. 4 (in order of mA). However, compared with the mono-layer $MoS_2$ transistor (e.g., semiconductor device 20) with antimonene (Sb) contact electrodes as shown in FIG. 6, four orders of magnitude photocurrent enhancement is observed for the $MoS_2$/graphene transistor (e.g., semiconductor device 10). The results of FIG. 6 have demonstrated that although enhanced photocurrents are observed for the standalone $MoS_2$ transistor with antimonene electrodes, the high contact resistance between metal and single $MoS_2$ layer (without graphene layer) will still induce huge loss in photocurrents.

Also shown in FIG. 5 is that the cut-off wavelength of the $MoS_2$/graphene photo-transistor is around 670.0 nm, which coincides with the PL peak wavelength. The results confirm that the photocurrents come from the light absorption of the $MoS_2$ layer. Calibrated by using an optical power meter, the peak responsivity of the device would reach 51.3 A/W at the wavelength 620.0 nm.

Figure 7:
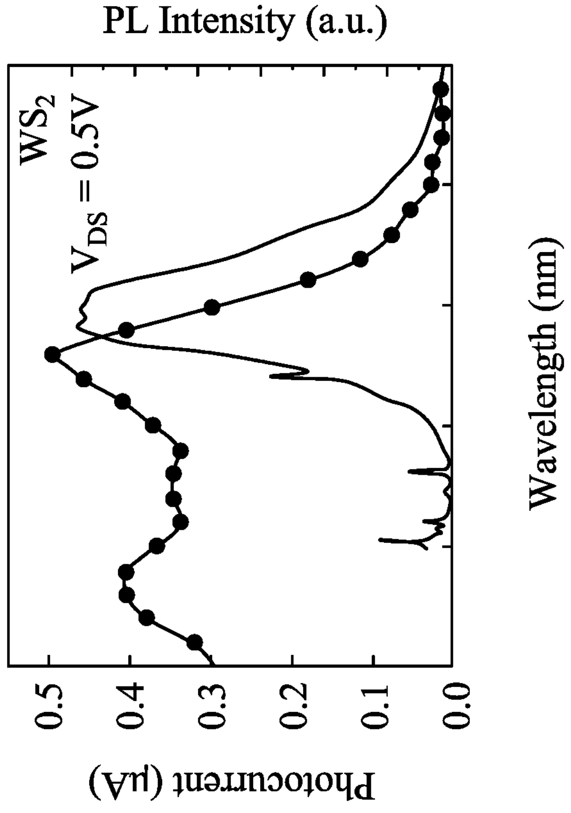

FIG. 7 shows experiment results of the semiconductor device 10 as shown in FIG. 1. FIG. 7 is different from FIG.

5, in that $WS_2$ layer is used as the 2-D material layer 110B of the semiconductor device 10. Based on the discussion of FIG. 5, the issue remained is if the same mechanism of carrier transport in between 2-D material layers (e.g., $MoS_2$/graphene) can apply for other 2-D materials. Following the same fabrication procedure as the $MoS_2$/graphene transistor of FIG. 5, the $WS_2$/graphene phototransistor is fabricated and the experiment results are shown in FIG. 7. The photocurrent values of the device under the light irradiation of different wavelengths at $V_{GS}$=0.0 V and $V_{DS}$=0.5 V are shown in FIG. 7. For comparison, the PL spectrum of the mono-layer $WS_2$ film transferred to the graphene surface is also shown in the figure. Compared with the $MoS_2$/graphene photo-transistor, the cut-off wavelength of the $WS_2$/graphene photo-transistor slightly moves to 650.0 nm, which is consistent with the PL peak wavelength of the $WS_2$ film transferred to the graphene surface. The lower photocurrent values of the $WS_2$/graphene photo-transistor are attributed to the inferior crystallinity of the $WS_2$ film prepared by using the RF sputtering system. Nevertheless, the compatible photocurrents with the $MoS_2$/graphene transistor suggest that the mechanism of photo-excited electrons in the 2-D absorption layer (e.g., $MoS_2$ or $WS_2$) transporting to the conducting 2-D channel (e.g., graphene) can be applied to different 2-D materials.

Based on the discussion of FIGS. 5, 6, and 7, compared with the standalone $MoS_2$ transistor (e.g., semiconductor device 20), the enhanced photocurrents in the $MoS_2$/graphene or $WS_2$/graphene transistor (e.g., semiconductor device 10) may indicate that easy carrier transport at the metal-TMDs-graphene structure are the main mechanism responsible for the much more efficient photocurrent collection efficiency of the $MoS_2$/graphene or $WS_2$/graphene transistor. That is, carriers may easily transport from metal (e.g., source/drain electrode 150) to graphene channel layer (e.g., 2-D material layer 110A) through the TMDs layer (e.g., 2-D material layer 110B). In previous experiment, it has been demonstrated that graphene is of low contact resistance electrodes for semiconductor 2-D materials such as $MoS_2$. The enhanced photocurrents suggest that an easier current flow path of the device is through the $MoS_2$/graphene interface with lower contact resistance.

FIGS. 8A to 13B illustrate a semiconductor device in various stages of fabrication in accordance with some embodiments of the present disclosure. In greater detail, FIGS. 8A, 9A, 10A, 11A, 12A, and 13A are schematic views of a semiconductor device, and FIGS. 8B, 9B, 10B, 11B, 12B, and 13B are cross-sectional views along line B-B of FIGS. 8A, 9A, 10A, 11A, 12A, and 13A, respectively.

Figure 8A:
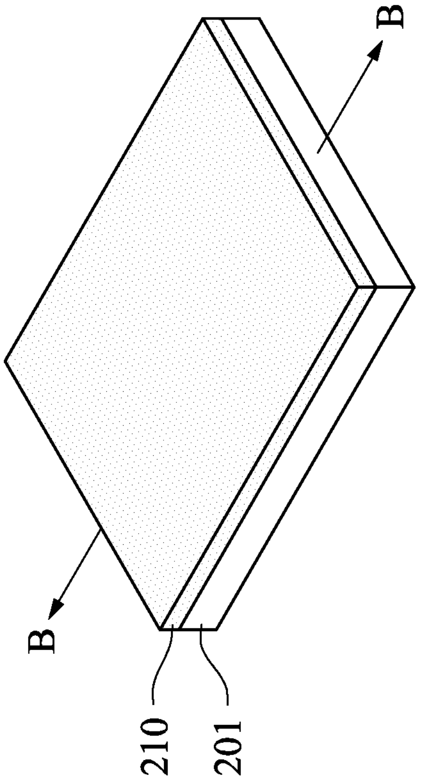
FIGS. 8A to 13B illustrate a semiconductor device in various stages of fabrication in accordance with some embodiments of the present disclosure.
Figure 8B:
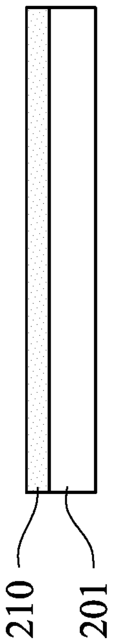

Reference is made to FIGS. 8A and 8B. Shown there is a substrate 201. For example, the substrate 201 may include sapphire (e.g. crystalline $Al_2O_3$), e.g. a large grain or a single crystalline layer of sapphire or a coating of sapphire. As another example, the substrate 201 may be a sapphire substrate, e.g. a transparent sapphire substrate including, as an example, $\alpha$-$Al_2O_3$. The substrate 201 may be a semiconductor substrate. Other elementary semiconductors like germanium may also be used for substrate 201. Alternatively or additionally, substrate 201 includes a compound semiconductor such as silicon carbide, gallium arsenide, indium arsenide, indium gallium arsenide (InGaAs) and/or indium phosphide.

A 2-D material layer 210 is formed over the substrate 201. In some embodiments, the 2-D material layer 210 is in direct contact with the top surface of the substrate 201. In some embodiments, the 2-D material layer 210 is made of graphene. In some embodiments, the 2-D material layer 210 is made of a single monolayer graphene. In some embodiments, exemplary technique for forming a graphene layer utilizes CVD (chemical vapor deposition) directly on the substrate 201. In some embodiments, the graphene layer may be formed by epitaxial graphene growth. For example, a silicon carbide dielectric is used as a seed layer to promote the epitaxial growth of the graphene on the substrate 201. In some other embodiments, graphene layer may be formed on a backing material (such as an adhesive tape), the backing material can be adhered to the substrate 201. Then, the backing material can be removed while leaving the graphene layer on the substrate 201. In some other embodiments, graphene is formed by reacting a metal film with silicon carbide to form a metal carbide. The metal carbide is annealed to produce a metal silicide and graphene from the remaining carbon. In yet other exemplary embodiments, graphene layer is deposited using an aqueous solution of graphene oxide.

Figure 9A:
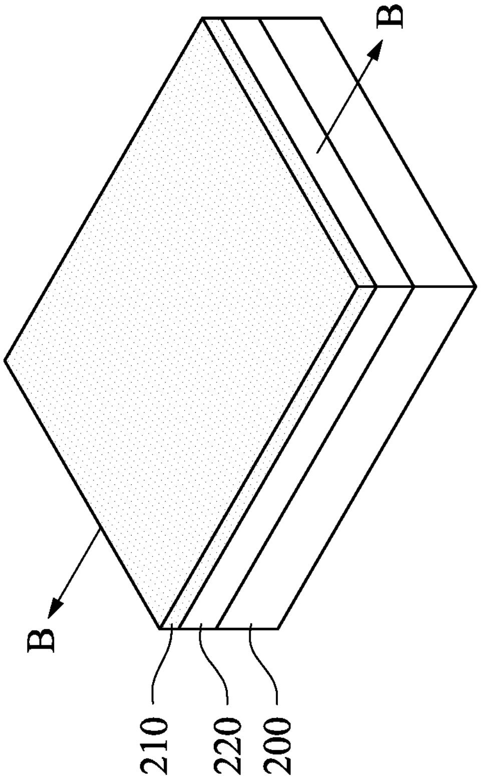
Figure 9B:
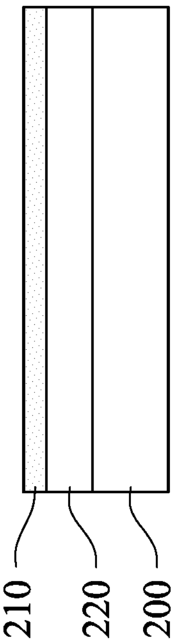

Reference is made to FIGS. 9A and 9B. The 2-D material layer 210 is transferred from the substrate 201 to a substrate 200. In greater detail, the 2-D material layer 210 is transferred to a dielectric layer 220 formed on a top surface of the substrate 200. In various embodiments, the transfer process may be performed using polydimethylsiloxane (PDMS), poly(methyl methacrylate) (PMMA)-assisted method, thermal release tape, a roll-to-roll transfer process, an electrochemical process, a direct transfer process (e.g., using applied pressure and/or heat), or other wet and/or dry transfer processes. In some embodiments, the 2-D material layer 210 is transferred to the substrate 200 using PDMS stamping.

As an example of PMMA-assisted method, a polymer film, such as poly(methyl methacrylate) (PMMA), is formed on the 2-D material layer 210 disposed on the substrate 201. After forming the polymer film, the sample is heated, such as by placing the sample on a hot plate. Subsequent to heating, a corner of the 2-D material layer 210 is peeled off the substrate 201, such as by using a tweezers, and the sample is submerged in a solution to facilitate the separation of the 2-D material layer 210 from the substrate 201. The 2-D material film and polymer film are transferred to the dielectric layer 220 on the substrate 200. The polymer film is then removed from the 2-D material layer 210 using a suitable solvent, while leaving the 2-D material layer 210 over the dielectric layer 220.

In some embodiments, the substrate 200 may be a conductive substrate, which may include p-doped polysilicon. In some embodiments, the conductive substrate 200 may serve as a gate electrode and the dielectric layer 220 may act a gate dielectric layer. In some embodiments, the dielectric layer 220 is silicon dioxide ($SiO_2$) or aluminum oxide ($Al_2O_3$), in other embodiments the dielectric layer 220 is a high-k dielectric. Accordingly, the conductive substrate 200 can also be referred to as a gate electrode, and the dielectric layer 220 can also be referred to as a gate dielectric layer. In some embodiments, the dielectric layer 220 and the conductive substrate 200 can be collectively referred to as a gate structure.

Figure 10B:
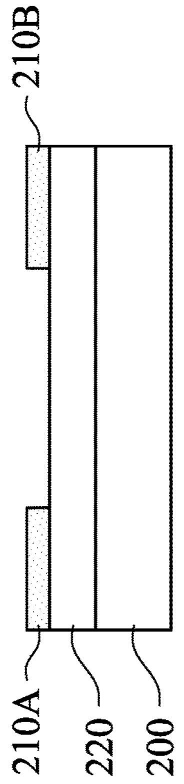
Figure 10A:
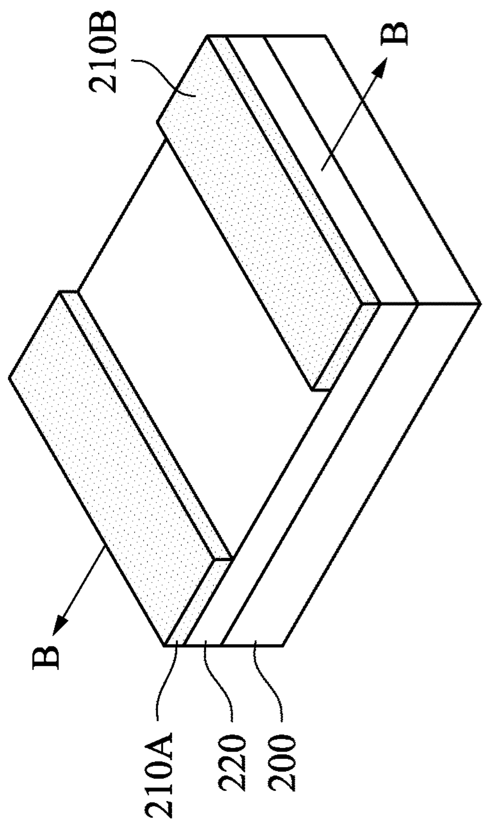

Reference is made to FIGS. 10A and 10B. A patterning process is performed to the 2-D material layer 210, so as to divide the 2-D material layer 210 into two portions separated from each other. In some embodiments, the patterning process may be performed by, for example, forming a mask layer (e.g., photoresist) over the 2-D material layer 210, the mask layer is then patterned to form an opening exposing unwanted portions of the 2-D material layer 210, an etching process is performed to remove the unwanted portions of the 2-D material layer 210 through the opening of the mask layer, and then removing the mask layer after the etching process is completed. The remaining portions of the 2-D material layer 210 may be referred to as 2-D material layers 210A and 210B.

Figure 11A:
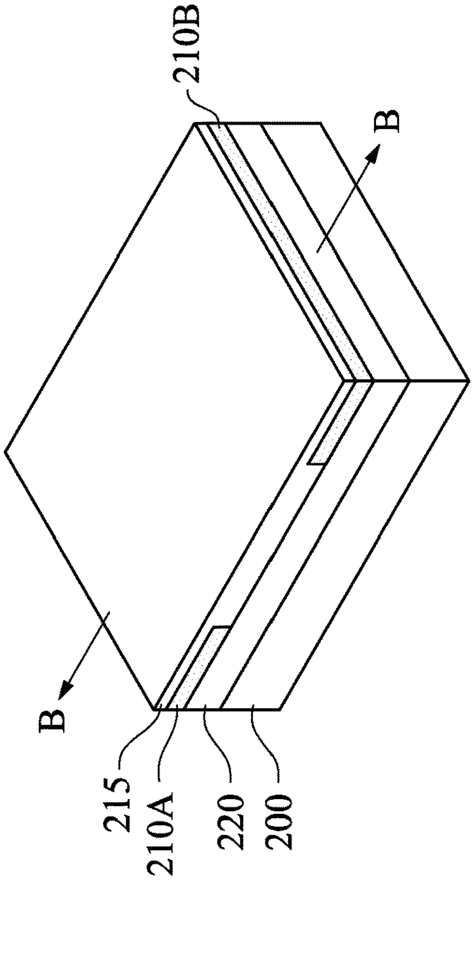
Figure 11B:
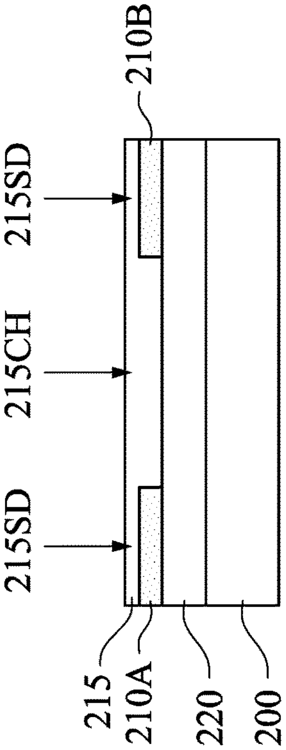

Reference is made to FIGS. 11A and 11B. A 2-D material layer 215 is formed over the substrate 200 and covering the 2-D material layers 210A and 210B. In some embodiments, the 2-D material layer 215 is made of transition metal dichalcogenides (TMDs). That is, the 2-D material layer 215 is a metal-containing 2-D material layer. In some embodiment where the 2-D material layer 215 includes TMDs monolayers, the TMDs monolayers include molybdenum disulfide ($MoS_2$), molybdenum diselenide ($MoSe_2$) molybdenum ditelluride ($MoTe_2$), tungsten disulfide ($WS_2$), tungsten diselenide ($WSe_2$), tungsten ditelluride ($WTe_2$), or the like. In some embodiments, the 2-D material layer 215 is a single monolayer 2-D material. In other embodiments, the 2-D material layer 215 has 1 to 5 monolayers of 2-D material.

In some embodiments where the 2-D material layer 215 is made of $MoS_2$, a $MoO_3$ film may be deposited over a graphene layer (e.g., the 2-D material layer 110) by using thermal evaporation. After the $MoO_3$ is deposited, a sulfurization procedure is performed. The substrate (e.g., the substrate 200) is placed in the center of a furnace for sulfurization. In some other embodiments, other physical deposition techniques such as molecular beam epitaxy (MBE), e-gun evaporation, RF sputtering and pulse laser deposition (PLD) may also be adopted for the depositions of the transition metals.

In some embodiments, the 2-D material layer 215 may serve as a channel layer of a semiconductor device. For example, the 2-D material layer 215 may include a channel region 215CH and source/drain regions 215SD on opposite sides of the channel region 215CH. In some embodiments, the 2-D material layers 210A and 210B are in contact with bottom surfaces of the source/drain regions 215SD of the 2-D material layer 215. In some embodiments, bottom surface of the channel region 215CH of the 2-D material layer 215 is substantially level with bottom surfaces of the 2-D material layers 210A and 210B.

Figure 12B:
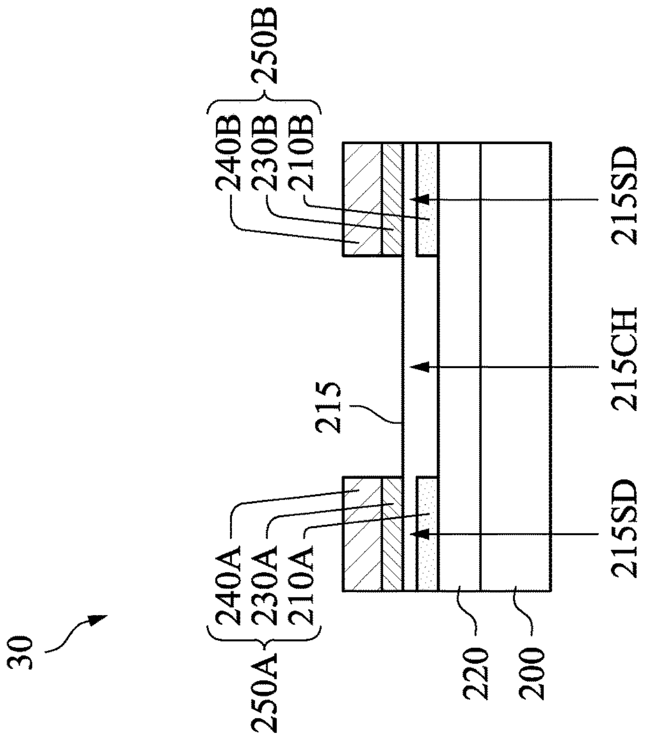
Figure 12A:
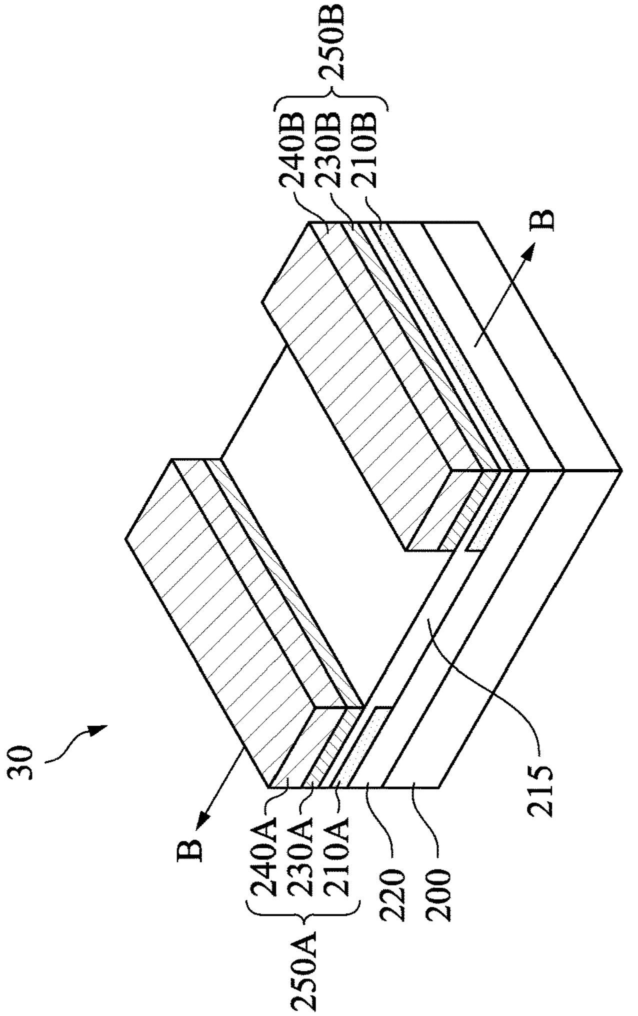

Reference is made to FIGS. 12A and 12B. First electrode layers 230A and 230B are formed over the top surfaces of the source/drain regions 215SD of the 2-D material layer 215, respectively. Second electrode layers 240A and 240B are formed over first electrode layers 230A and 230B, respectively.

In some embodiments, the 2-D material layer 215 may function as n-type channel layer. In such condition, metals with work function value that is smaller than the work function value of the 2-D material layer 215 may be suitable candidates as the Ohmic contact metals for n-channel transistors. In such embodiments, the first electrode layers 230A and 230B may include graphene, Ge, Sn, Sb, Ag, Al, Ti and Cu. In some embodiments, the first electrode layers 230A and 230B may include 2-D material metal layer, such as antimonene.

In some embodiments, the 2-D material layer 215 may function as p-type channel layer. In such condition, metals with work function value that is larger than the work function value of the 2-D material layer 215 may be suitable candidates as the Ohmic contact metals for n-channel transistors. In such embodiments, the first electrode layers 230A and 230B may include Au and Pt.

In some embodiments, the first electrode layers 230A and 230B and the second electrode layers 240A and 240B are formed by, for example, depositing a patterned mask over the substrate 200, the patterned mask may include openings that expose source/drain regions 215SD of the 2-D material layer 215. A material of the first electrode layers 230A and 230B and a material of the second electrode layers 240A and 240B are sequentially deposited in the openings of the patterned mask. Then, the patterned mask is removed, leaving portions of the material of the first electrode layers 230A and 230B and the material of the second electrode layers 240A and 240B in the openings of the patterned mask over the source/drain regions 215SD of the 2-D material layer 215.

In some other embodiments, the first electrode layers 230A and 230B and the second electrode layers 240A and 240B may also be formed by, for example, depositing a material of the first electrode layers 230A and 230B and a material of the second electrode layers 240A and 240B over the substrate 200, and then performing a patterning process to selectively etch (or remove) unwanted portions of the material of the first electrode layers 230A and 230B and the material of the second electrode layers 240A and 240B.

Figure 13A:
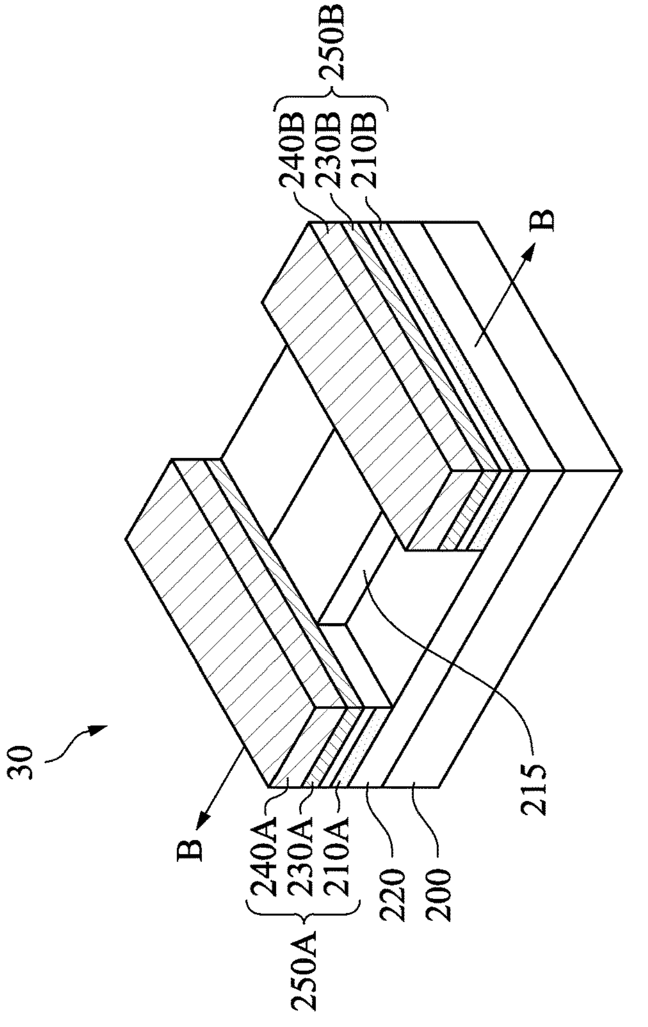
Figure 13B:
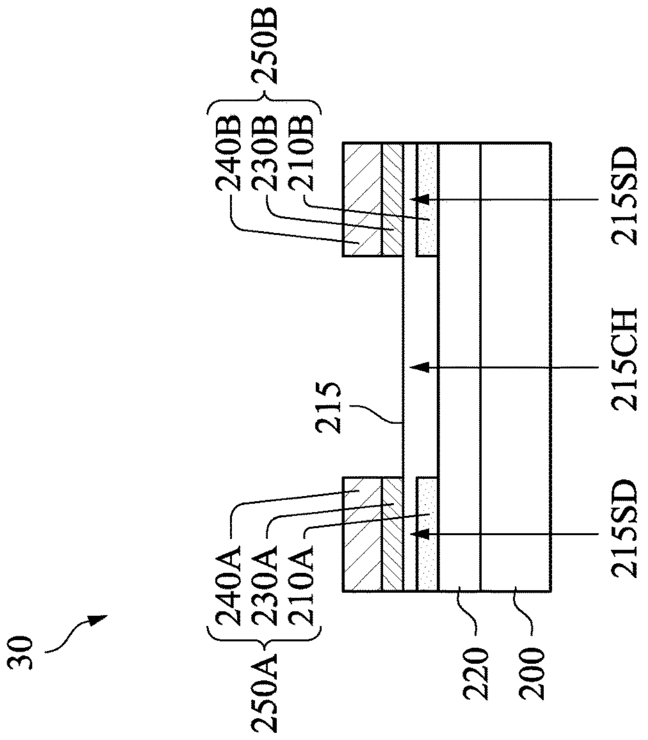

Reference is made to FIGS. 13A and 13B. A patterning process is performed to the 2-D material layer 215. In greater detail, the patterning process is performed to narrow down the channel region 215CH of the 2-D material layer 215. In some embodiments, the patterning process may be performed by, for example, forming a patterned mask over the substrate 200, the patterned mask may include openings the expose unwanted portions of the channel region 215CH of the 2-D material layer 215. An etching process is performed to remove the unwanted portions of the channel region 215CH of the 2-D material layer 215 through the openings of the patterned mask. Afterwards the patterned mask is removed.

After the process of FIGS. 12A and 12B is completed, a semiconductor device 30 is formed. The 2-D material layer 215 serves as a channel layer of the semiconductor device 30, in which the 2-D material layer 215 includes a channel region 215CH and source/drain regions 215SD on opposite sides of the channel region 215CH. The conductive substrate 200 and the dielectric layer 220, in which the dielectric layer 220 is in contact with the channel region 215H of the semiconductor device, may serve as the gate structure of the semiconductor device 30. The 2-D material layer 210A, the first electrode layer 230A, the second electrode layer 240A may collectively serve as a source/drain electrode 250A of the semiconductor device 30. Similarly, the 2-D material layer 210B, the first electrode layer 230B, the second electrode layer 240B may collectively serve as a source/drain electrode 250B of the semiconductor device 30.

With respect to the source/drain electrode 250A, the source/drain electrode 250A includes a first portion (e.g., the 2-D material layer 210A) in contact with bottom surface of the 2-D material layer 215, and a second portion (e.g., the first electrode layer 230A and the second electrode layer 240A) in contact with top surface of the 2-D material layer 215. Similarly, the source/drain electrode 250B includes a first portion (e.g., the 2-D material layer 210B) in contact with bottom surface of the 2-D material layer 215, and a second portion (e.g., the first electrode layer 230B and the second electrode layer 240B) in contact with top surface of the 2-D material layer 215.

Figure 14:
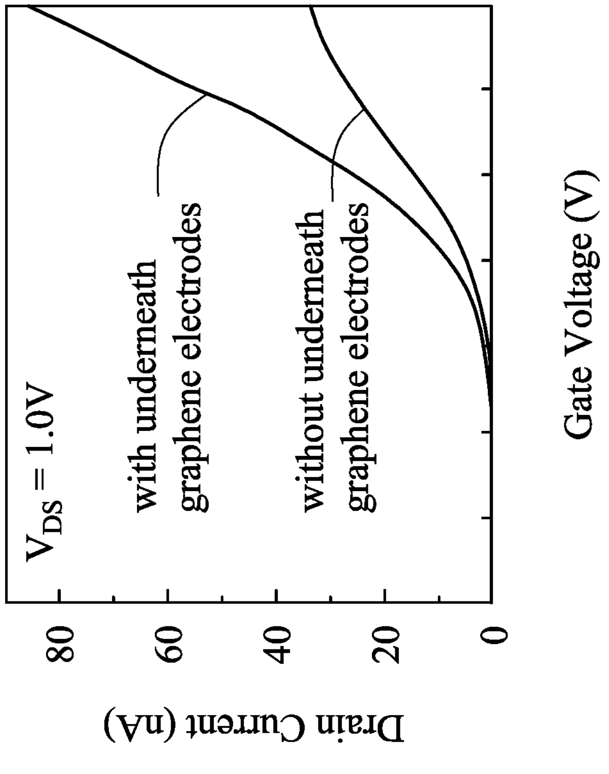
FIG. 14 shows experiment results of semiconductor devices in accordance with some embodiments of the present disclosure.

FIG. 14 shows experiment results of the semiconductor device 30 as shown in FIGS. 13A and 13B. In greater details, FIG. 14 shows two different conditions of the semiconductor device 30. In a first condition, graphene is used as the 2-D material layers 210A and 210B of the source/drain electrodes 250A and 250B, respectively, and $MoS_2$ is used as the 2-D material layer 215. In a second condition, the 2-D material layers 210A and 210B are absent in the semiconductor device 30. The transfer curves of the semiconductor device 30 with and without the underneath graphene electrodes are shown in FIG. 14. As shown in FIG. 14, over 20 times drain current enhancement is observed for the device with underneath graphene electrode (e.g., the 2-D material layers 210A and 210B). Graphene electrode is located underneath the 2-D material channel layer 215 (e.g., $MoS_2$) while metal electrodes (e.g., first electrode layers 230A/230B and second electrode layers 240A/240B) are located on top of the 2-D material channel layer 215. As discussed above, carriers from the metal electrodes can transport through the thin $MoS_2$ layer and reach the underneath graphene electrodes. The enhanced drain currents of the device with underneath graphene electrodes suggest that an easier current flow path of the device is through the $MoS_2$/graphene interface with lower contact resistance.

In the embodiments of FIGS. 13A and 13B, the 2-D material layers 210A and 210B (e.g., graphene) are formed underneath the 2-D material channel layer 215 (e.g., $MoS_2$), not on the top of the 2-D material channel layer 215. This is because due to the high growth temperature of graphene, it is difficult to grow graphene on top of $MoS_2$ surface. Selective etching/patterning of graphene is also difficult to achieve on $MoS_2$ surfaces. Therefore, for most 2-D material devices, the metal deposition instead of graphene attachment/growth is still the common approach for the electrode formation. To overcome this problem, one possible solution is to define the graphene electrodes before the $MoS_2$ attachment/growth.

FIGS. 15 to 21 illustrate a semiconductor device in various stages of fabrication in accordance with some embodiments of the present disclosure. It is noted that some elements of FIGS. 15 to 21 are similar to those described in FIGS. 8A to 13B, such elements are labeled the same, and relevant details will not be repeated for brevity.

Figure 15:
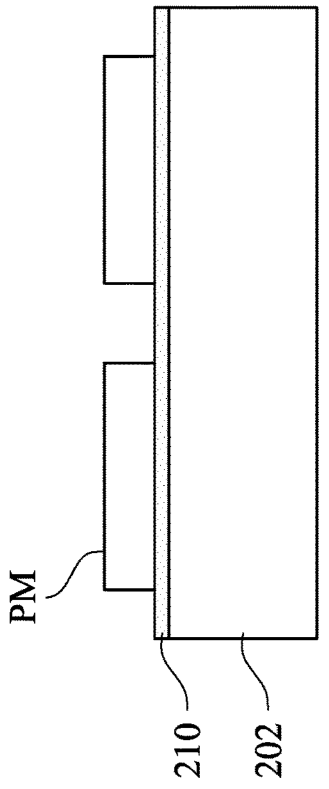

Reference is made to FIG. 15. Shown there is a substrate 202. In some embodiments, the substrate 202 may function to provide mechanical and/or structure support for features or structures that are formed in the subsequent steps of the process flow illustrated in FIGS. 15 to 21. These features or structures may be parts or portions of an integrated circuit (e.g., transistor, interconnect structure, etc.) that may be formed on or over the substrate 202.

The substrate 202 illustrated in FIG. 15 may include a bulk semiconductor substrate. The semiconductor substrate may include crystalline semiconductor material silicon, or may include one or more other semiconductor materials such as germanium, silicon-germanium alloys, compound semiconductors (e.g., GaAs, AlAs, InAs, GaN, AlN, and the like), or their alloys (e.g., $Ga_xAl_{1-x}As$, $Ga_xAl_{1-x}N$, $In_xGa_{1-x}As$ and the like), oxide semiconductors (e.g., ZnO, $SnO_2$, $TiO_2$, $Ga_2O_3$, and the like) or combinations thereof. The semiconductor materials may be doped or undoped. Other substrates that may be used include multi-layered substrates, gradient substrates, or hybrid orientation substrates. In some other embodiments, the substrate 202 may include sapphire (e.g. crystalline $Al_2O_3$), e.g. a large grain or a single crystalline layer of sapphire or a coating of sapphire. As another example, the substrate 202 may be a sapphire substrate, e.g. a transparent sapphire substrate comprising, as an example, $\alpha$-$Al_2O_3$. Other elementary semiconductors like germanium may also be used for substrate 202.

A 2-D material layer 210 is formed over the substrate 202. In some embodiments, the 2-D material layer 210 is in direct contact with the top surface of the substrate 202. In some embodiments, the 2-D material layer 210 is made of graphene. In some embodiments, the 2-D material layer 210 is made of a single monolayer graphene.

A patterned mask MA is formed over the 2-D material layer 210. The patterned mask MA includes openings that expose portions of the 2-D material layer 210. In some embodiments, the patterned mask MA may be photoresist or hard mask, and may be patterned using suitable photolithography process.

Figure 16:
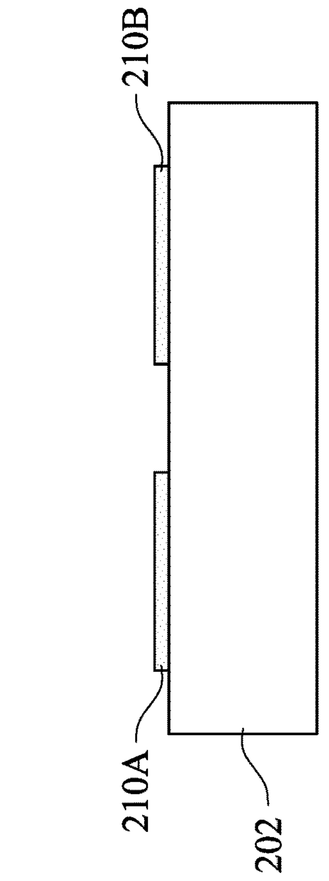
FIGS. 15 to 21 illustrate a semiconductor device in various stages of fabrication in accordance with some embodiments of the present disclosure.

Reference is made to FIG. 16. Portions of the 2-D material layer 210 that are exposed by the patterned mask MA are removing through an etching process. Portions of the 2-D material layer 210 covered by the patterned mask MA remain over the 2-D material layer 210 after the etching process. The remaining portions of the 2-D material layer 210 are referred to as 2-D material layers 210A and 210B.

Figure 17:
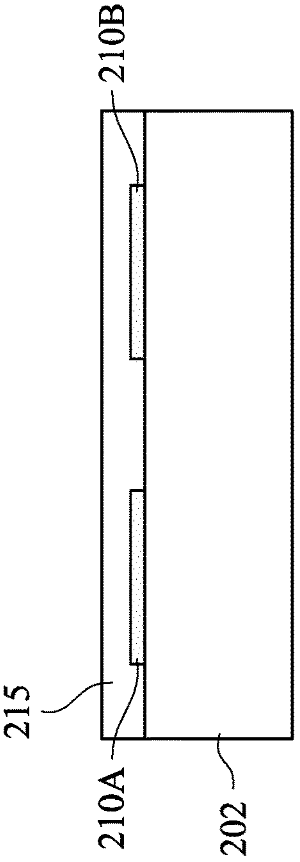

Reference is made to FIG. 17. A 2-D material layer 215 is formed over the 2-D material layers 210A and 210B. In some embodiments, the 2-D material layer 215 may be in contact with top surface of the substrate 202, and may be in contact with top surface and sidewalls of each of the 2-D material layers 210A and 210B. In some embodiments, the 2-D material layer 215 is made of transition metal dichalcogenides (TMDs). That is, the 2-D material layer 215 is a metal-containing 2-D material layer. In some embodiment where the 2-D material layer 215 includes TMDs monolayers, the TMDs monolayers include molybdenum disulfide ($MoS_2$), molybdenum diselenide ($MoSe_2$) molybdenum ditelluride ($MoTe_2$), tungsten disulfide ($WS_2$), tungsten diselenide ($WSe_2$), tungsten ditelluride ($WTe_2$), or the like.

Figure 18:
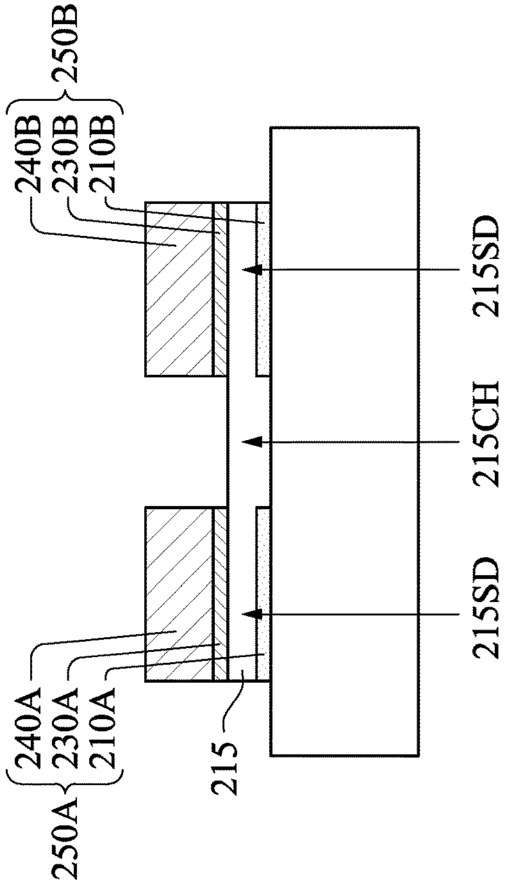

Reference is made to FIG. 18. First electrode layers 230A and 230B are formed over the top surfaces of the 2-D material layer 215, respectively. Second electrode layers 240A and 240B are formed over first electrode layers 230A and 230B, respectively.

Afterwards, a patterning process is performed to the 2-D material layer 215. In greater detail, the patterning process is performed to remove portions of the 2-D material layer 215. The remaining portion of the 2-D material layer 215 serves as a channel layer of a semiconductor device (e.g., semiconductor device 40 in FIG. 20), in which the 2-D material layer 215 includes a channel region 215CH and source/drain regions 215SD on opposite sides of the channel region 215CH. The 2-D material layer 210A, the first electrode layer 230A, the second electrode layer 240A may collectively serve as a source/drain electrode 250A of the semiconductor device 30. Similarly, the 2-D material layer 210B, the first electrode layer 230B, the second electrode layer 240B may collectively serve as a source/drain electrode 250B of the semiconductor device 30. The source/drain electrodes 250A and 250B are in contact with the source/drain regions 215SD of the 2-D material layer 215, respectively.

With respect to the source/drain electrode 250A, the source/drain electrode 250A include a first portion (e.g., the 2-D material layer 210A) in contact with bottom surface of the 2-D material layer 215, and a second portion (e.g., the first electrode layer 230A and the second electrode layer 240A) in contact with top surface of the 2-D material layer 215. Similarly, the source/drain electrode 250B include a first portion (e.g., the 2-D material layer 210B) in contact with bottom surface of the 2-D material layer 215, and a second portion (e.g., the first electrode layer 230B and the second electrode layer 240B) in contact with top surface of the 2-D material layer 215.

Figure 19:
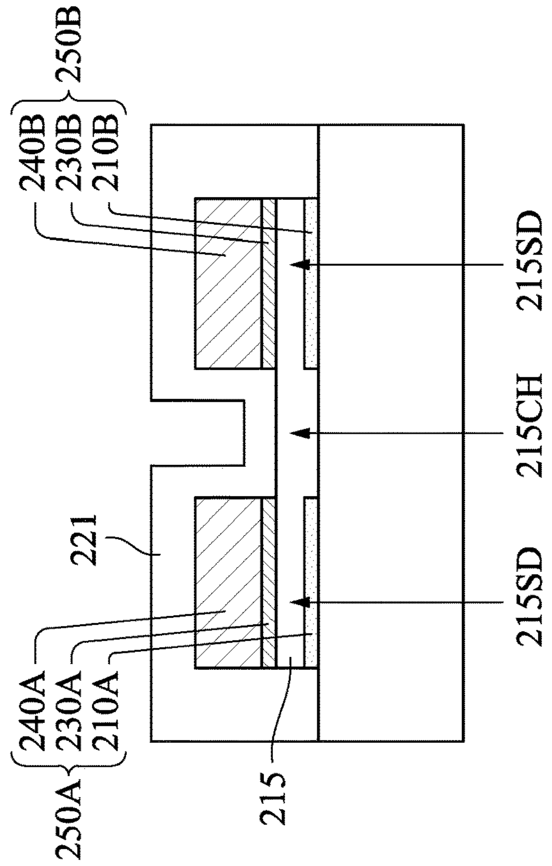

Reference is made to FIG. 19. A gate dielectric layer 221 is formed over the substrate 202. In some embodiments, the gate dielectric layer 221 may be silicon dioxide (e.g., $SiO_2$) or aluminum oxide ($Al_2O_3$), while in other embodiments the gate dielectric layer 221 may be a high-k dielectric. The gate dielectric layer 221 may be formed by suitable deposition process, such as chemical vaper deposition (CVD), physical vaper deposition (PVD), atomic layer deposition (ALD), or the like.

The gate dielectric layer 221 is in contact with the channel region 215CH of the 2-D material layer 215. The gate dielectric layer 221 may also be in contact with the source/drain electrodes 250A and 250B. In greater detail, the gate dielectric layer 221 may be in contact with top surface and opposite sidewalls of each of the source/drain electrodes 250A and 250B.

Figure 20:
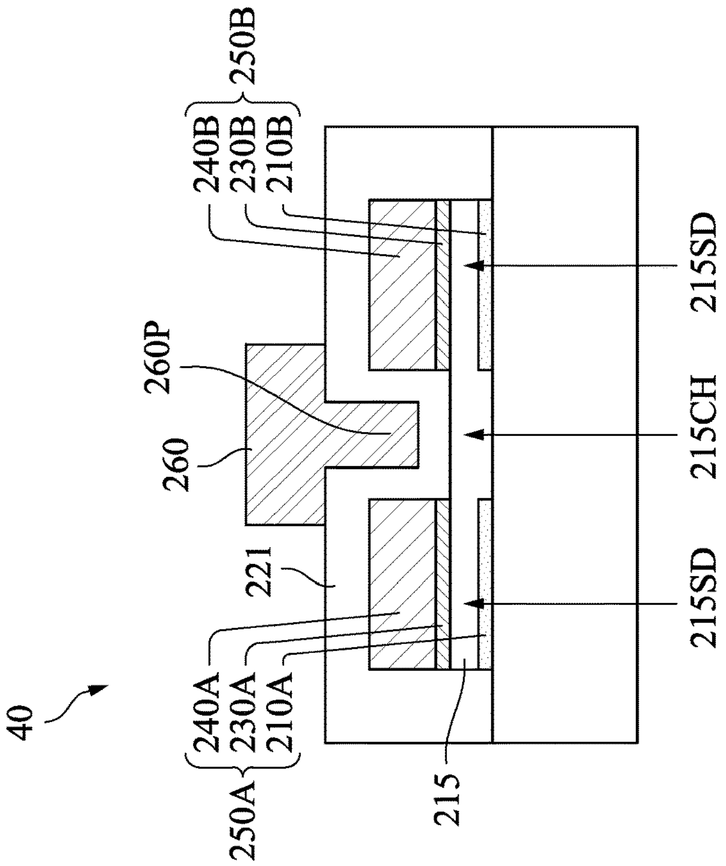

Reference is made to FIG. 20. A gate electrode 260 is formed over the dielectric layer 221. After the gate electrode 260 is formed, a semiconductor device 40 is formed. In some embodiments, the gate electrode 260 may include conductive material, such as metal. Exemplary metal may include copper (Cu), ruthenium (Ru), iridium (Ir), rhodium (Rh), gold (Au), silver (Ag), platinum (Pt), tungsten (W), or other suitable metals. In some embodiments, the gate electrode 260 may be formed by, for example, depositing a metal layer blanket over the substrate 202, and then patterning the metal layer. The gate electrode 260 includes a portion 260P that is laterally between the source/drain electrodes 250A and 250B. In some embodiments, the portion 260P does not overlap the 2-D material layers 210A and 210B.

Figure 21:
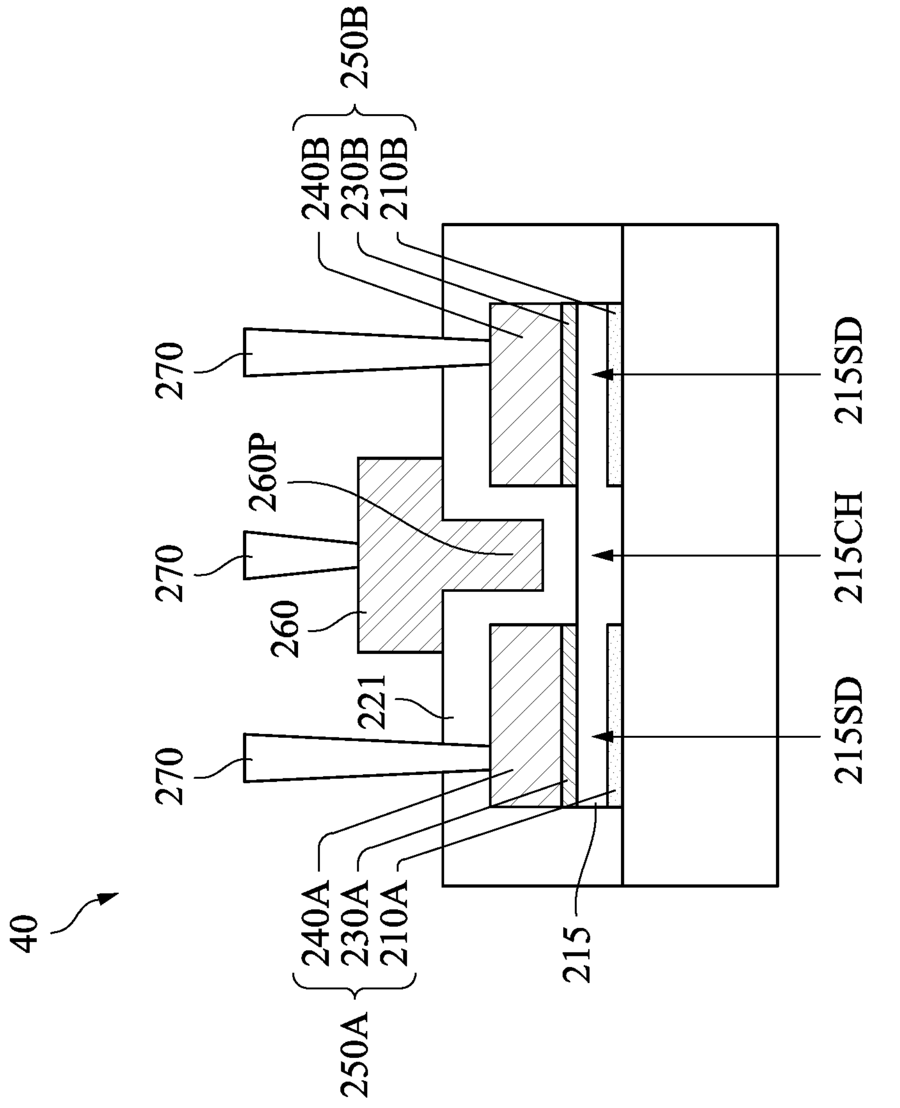

Reference is made to FIG. 21. Vias 270 are formed over the substrate 202 and in contact with the source/drain electrodes 250A and 250B and the gate electrode 260, respectively. Portions of the vias 270 that are in contact with the source/drain electrodes 250A and 250B may penetrate through the gate dielectric layer 221. In some embodiments, the vias 270 may include conductive material, such as metal. Exemplary metal may include copper (Cu), ruthenium (Ru), iridium (Ir), rhodium (Rh), gold (Au), silver (Ag), platinum (Pt), tungsten (W), or other suitable metals. In some embodiments, the vias 270 may be formed by, for example, depositing a dielectric layer (not shown) over the substrate 202, performing an etching process to the dielectric layer and the gate dielectric layer 221 to form openings exposing the source/drain electrodes 250A and 250B and the gate electrode 260, and then forming a metal in the openings.

FIGS. 22 to 30 illustrate a semiconductor device in various stages of fabrication in accordance with some embodiments of the present disclosure. It is noted that some elements of FIGS. 22 to 30 are similar to those described in FIGS. 15 to 21, such elements are labeled the same, and relevant details will not be repeated for brevity.

Figure 22:
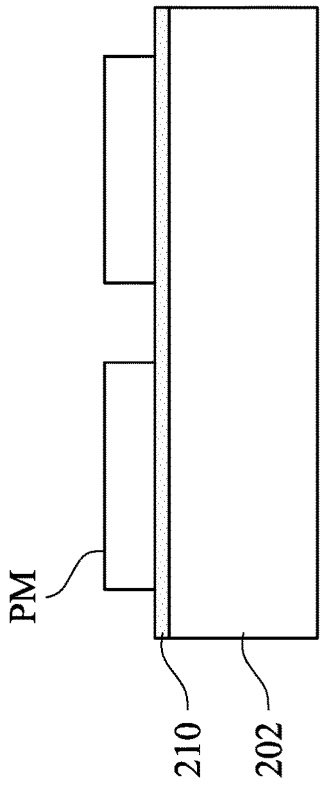
FIGS. 22 to 30 illustrate a semiconductor device in various stages of fabrication in accordance with some embodiments of the present disclosure.

Reference is made to FIG. 22. Shown there is a substrate 202. A 2-D material layer 210 is formed over the substrate 202. In some embodiments, the 2-D material layer 210 is in direct contact with the top surface of the substrate 202. In some embodiments, the 2-D material layer 210 is made of graphene. In some embodiments, the 2-D material layer 210 is made of a single monolayer graphene. A patterned mask MA is formed over the 2-D material layer 210. The patterned mask MA includes openings that expose portions of the 2-D material layer 210.

Figure 23:
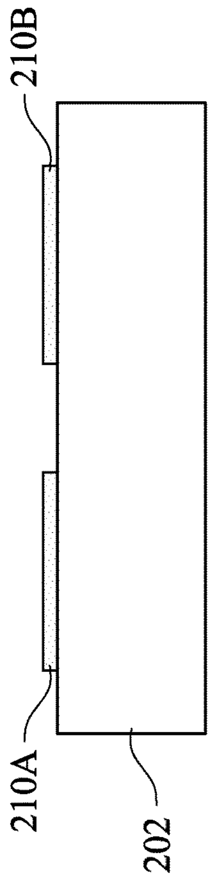

Reference is made to FIG. 23. Portions of the 2-D material layer 210 that are exposed by the patterned mask MA are removing through an etching process. Portions of the 2-D material layer 210 covered by the patterned mask MA remain over the 2-D material layer 210 after the etching process. The remaining portions of the 2-D material layer 210 are referred to as 2-D material layers 210A and 210B.

Figure 24:
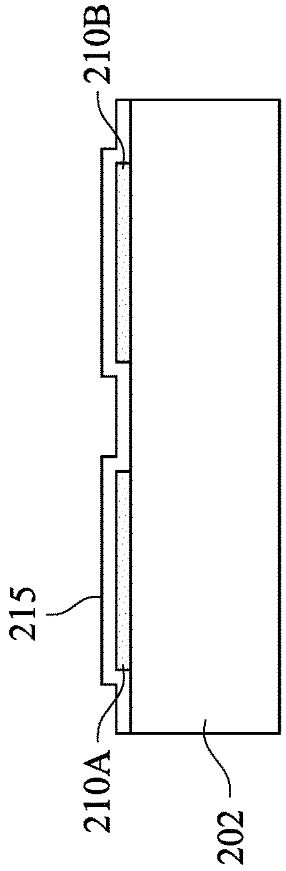

Reference is made to FIG. 24. A 2-D material layer 215 is formed over the 2-D material layers 210A and 210B. In some embodiments, the 2-D material layer 215 is made of transition metal dichalcogenides (TMDs). That is, the 2-D material layer 215 is a metal-containing 2-D material layer. In some embodiment where the 2-D material layer 215 includes TMDs monolayers, the TMDs monolayers include molybdenum disulfide ($MoS_2$), molybdenum diselenide ($MoSe_2$) molybdenum ditelluride ($MoTe_2$), tungsten disulfide ($WS_2$), tungsten diselenide ($WSe_2$), tungsten ditelluride ($WTe_2$), or the like. In some embodiments, the 2-D material layer 215 may serve as a channel layer of a semiconductor device (e.g., semiconductor device 50 in FIG. 29). For example, the 2-D material layer 215 may include a channel region 215CH and source/drain regions 215SD on opposite sides of the channel region 215CH. In some embodiments, the 2-D material layer 215 may be in contact with top surface of the substrate 202, and may be in contact with top surface and sidewalls of each of the 2-D material layers 210A and 210B.

Figure 25:
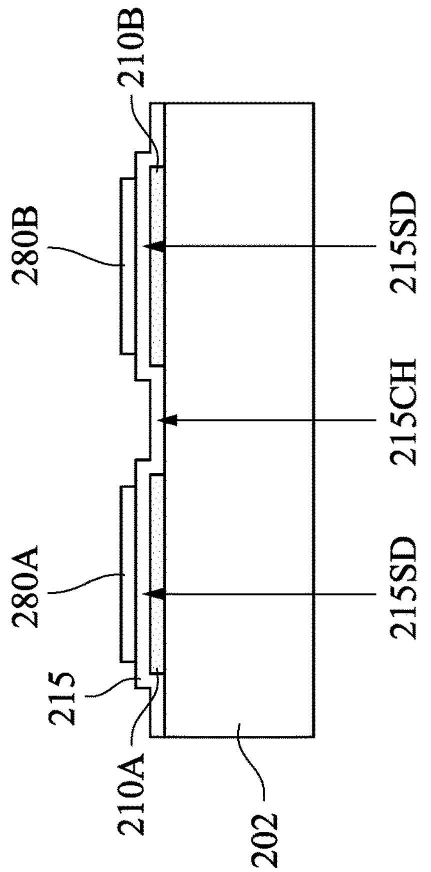

Reference is made to FIG. 25. Interlayer electrodes 280A and 280B are formed over the 2-D material layer 215. In greater detail, the interlayer electrodes 280A and 280B are formed over the source/drain regions 215SD of the 2-D material layer 215, respectively. In some embodiments, the interlayer electrodes 280A and 280B may be made of metal, such as antimonene (Sb), germanium (Ge), tin (Sn), bismuth (Bi), or the like. In some other embodiments, the interlayer electrodes 280A and 280B may be graphene. The interlayer electrodes 280A and 280B may be formed by, for example, depositing an electrode material over the substrate 202, and then patterning the electrode material. In some embodiments, thickness of each of the interlayer electrodes 280A and 280B may be in a range from about 1 nm to about 10 nm.

Figure 26:
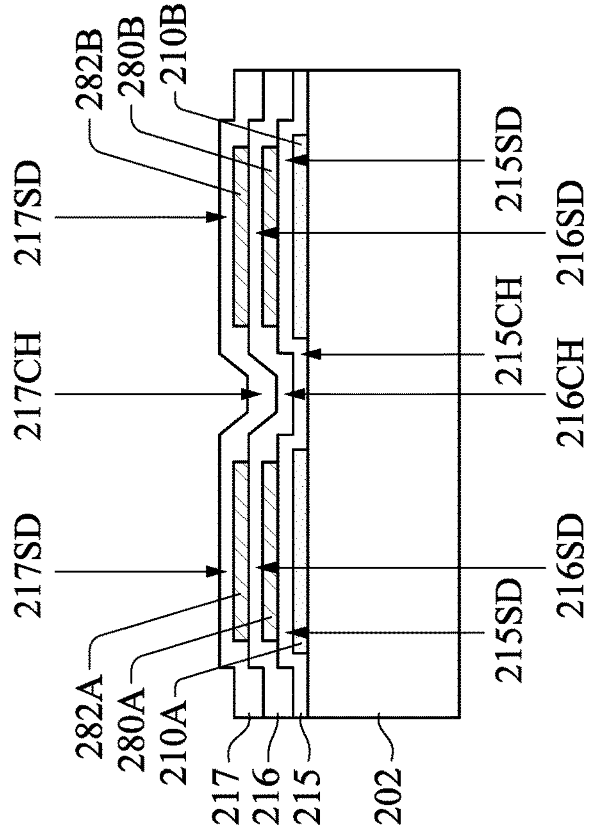

Reference is made to FIG. 26. A 2-D material layer 216 is formed over the 2-D material layer 215 and covering the interlayer electrodes 280A and 280B. In some embodiments, the material and the formation method of the 2-D material layer 216 may be similar to those described with respect to the 2-D material layer 215, and thus relevant details will not be repeated for brevity. In some embodiments, the 2-D material layer 216 may serve as a channel layer of a semiconductor device (e.g., semiconductor device 50 in FIG. 29). For example, the 2-D material layer 216 may include a channel region 216CH and source/drain regions 216SD on opposite sides of the channel region 216CH. In some embodiments, the channel region 216CH of the 2-D material layer 216 may be in contact with the channel region 215CH of the 2-D material layer 215. The interlayer electrodes 280A and 280B are interposed between the 2-D material layer 215 and the 2-D material layer 216, and are in contact with the source/drain regions 216SD of the 2-D material layer 216, respectively. The 2-D material layer 216 may cover the interlayer electrodes 280A and 280B, and may be in contact with top surface and sidewalls of each of the interlayer electrodes 280A and 280B. In some embodiments, bottommost surface of the 2-D material layer 216 is lower than bottom surface of each of the interlayer electrodes 280A and 280B.

Interlayer electrodes 282A and 282B are formed over the 2-D material layer 216. In greater detail, the interlayer electrodes 282A and 282B are formed over the source/drain regions 216SD of the 2-D material layer 216, respectively. In some embodiments, the material and the formation method of the interlayer electrodes 282A and 282B may be similar to those described with respect to the interlayer electrodes 280A and 280B, and thus relevant details will not be repeated for brevity.

A 2-D material layer 217 is formed over the 2-D material layer 216 and covering the interlayer electrodes 282A and 282B. In some embodiments, the material and the formation method of the 2-D material layer 217 may be similar to those described with respect to the 2-D material layer 215, and thus relevant details will not be repeated for brevity. In some embodiments, the 2-D material layer 217 may serve as a channel layer of a semiconductor device (e.g., semiconductor device 50 in FIG. 29). For example, the 2-D material layer 217 may include a channel region 217CH and source/drain regions 217SD on opposite sides of the channel region 217CH. In some embodiments, the channel region 217CH of the 2-D material layer 217 may be in contact with the channel region 216CH of the 2-D material layer 216. The interlayer electrodes 282A and 282B are interposed between the 2-D material layer 216 and the 2-D material layer 217, and are in contact with the source/drain regions 217D of the 2-D material layer 217, respectively. The 2-D material layer 217 may cover the interlayer electrodes 282A and 282B, and may be in contact with top surface and sidewalls of each of the interlayer electrodes 282A and 282B. In some embodiments, bottommost surface of the 2-D material layer 217 is lower than bottom surface of each of the interlayer electrodes 282A and 282B.

Figure 27:
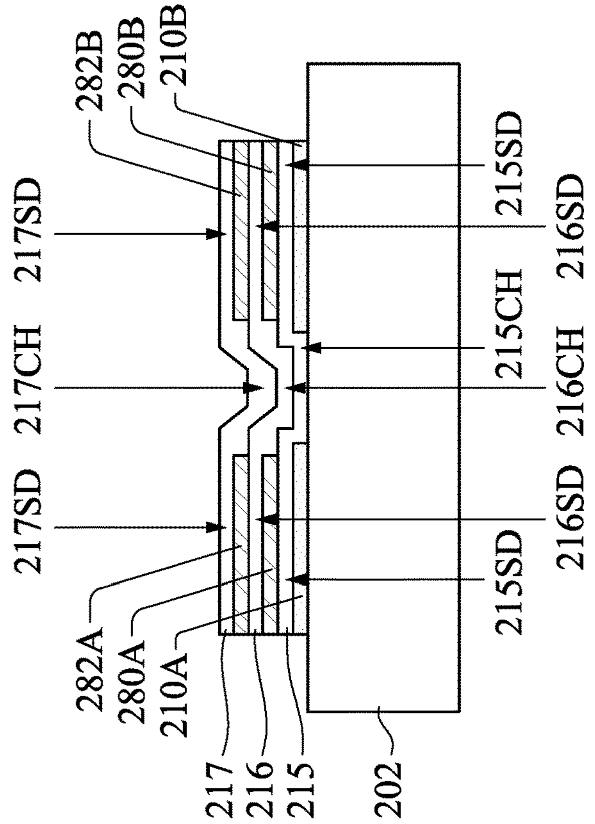

Reference is made to FIG. 27. The 2-D material layers 215, 216, and 217 are patterned, so as to remove portions of the 2-D material layers 215, 216, and 217. The 2-D material layers 215, 216, and 217 may be patterned by, for example, forming a patterned mask over the substrate 202, the patterned mask having openings exposing portions of the 2-D material layers 215, 216, and 217. The exposed portions of the 2-D material layers 215, 216, and 217 are then removed using suitable etching process. Afterwards the patterned mask is removed.

Figure 28:
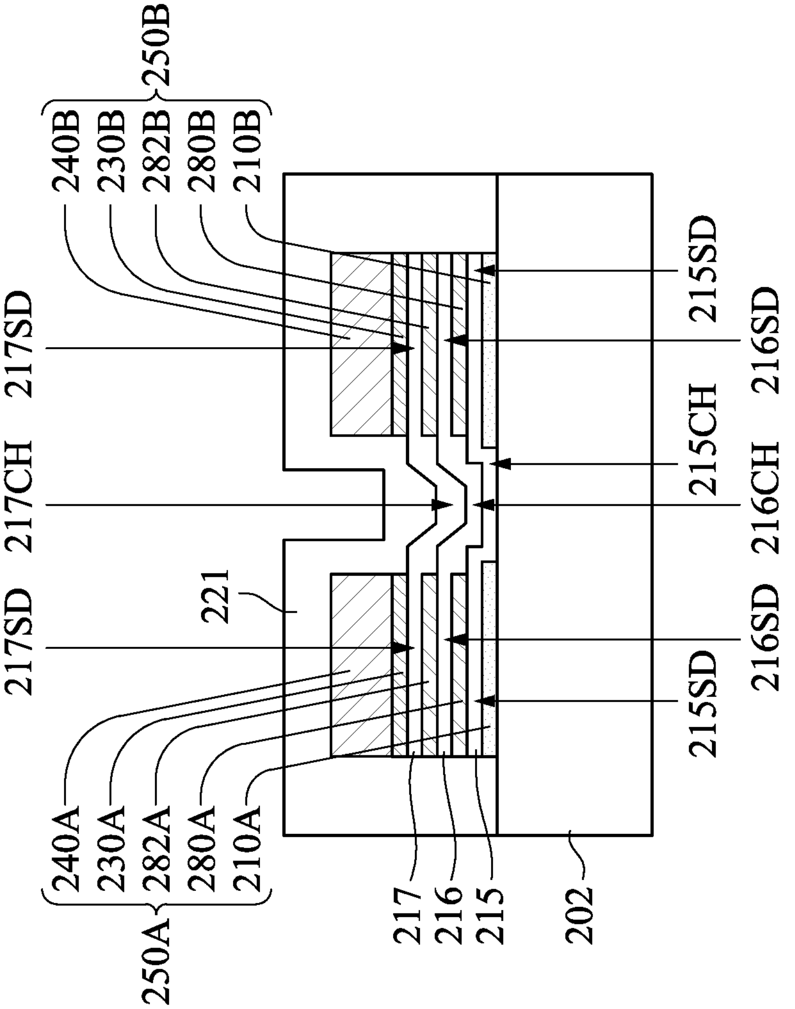

Reference is made to FIG. 28. First electrode layers 230A and 230B are formed over the top surfaces of the source/drain regions 217SD of the 2-D material layer 217, respectively. Second electrode layers 240A and 240B are formed over first electrode layers 230A and 230B, respectively.

Figure 29:
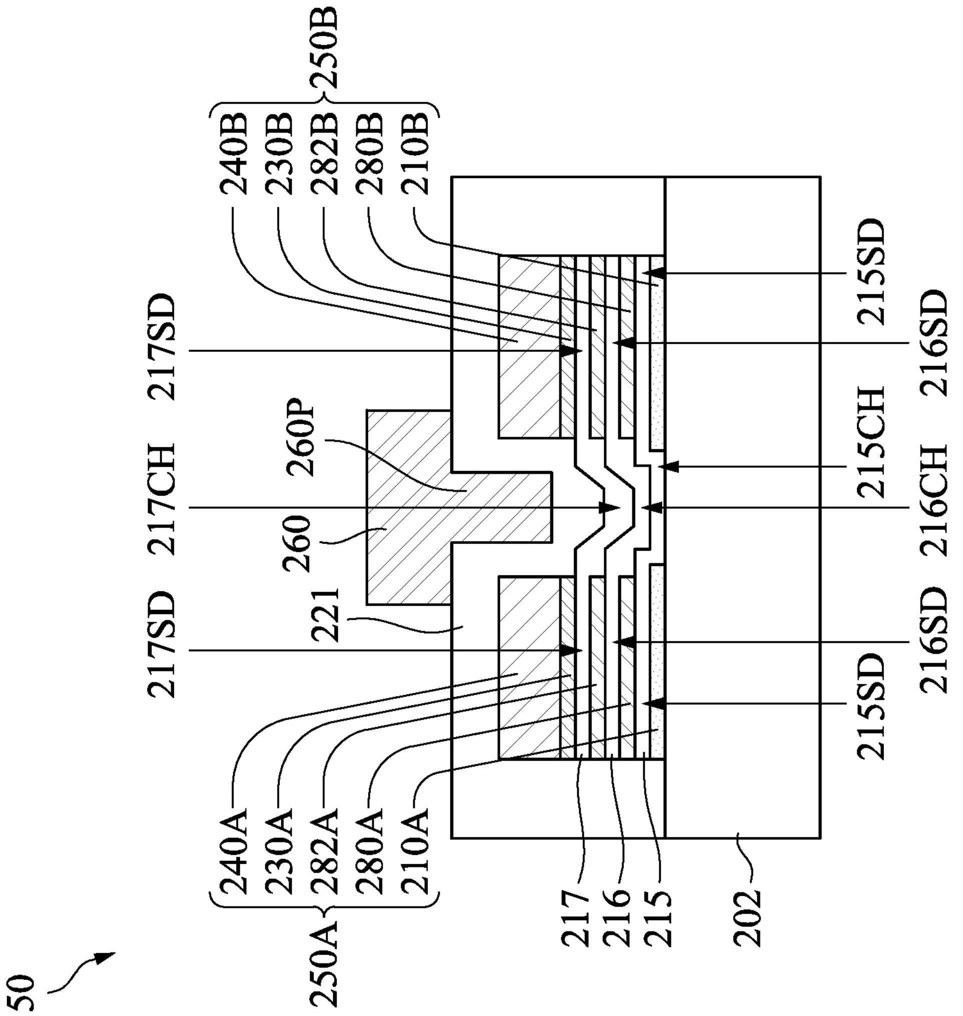

The 2-D material layer 210A, the interlayer electrode 280A, the interlayer electrode 282A, the first electrode layer 230A, and the second electrode layer 240A may collectively referred to as a source/drain electrode 250A of a semiconductor device (e.g., the semiconductor device of FIG. 29). The 2-D material layer 210B, the interlayer electrode 280B, the interlayer electrode 282B, the first electrode layer 230B, and the second electrode layer 240B may collectively referred to as a source/drain electrode 250B of a semiconductor device (e.g., the semiconductor device of FIG. 29).

A gate dielectric layer 221 is formed over the substrate 202. The gate dielectric layer 221 is in contact with the channel region 217CH of the 2-D material layer 217. The gate dielectric layer 221 may also in contact with the source/drain electrodes 250A and 250B. In greater detail, the gate dielectric layer 221 may be in contact with top surface and opposite sidewalls of each of the source/drain electrodes 250A and 250B. In some embodiments, the gate dielectric layer 221 may be in contact with outer sidewalls of the 2-D material layers 210A and 210B, outer sidewalls of the 2-D material layers 215, 216, and 217, outer sidewalls of the interlayer electrodes 280A and 280B, and outer sidewalls of the interlayer electrodes 282A and 282B.

Reference is made to FIG. 29. A gate electrode 260 is formed over the dielectric layer 221. After the gate electrode 260 is formed, a semiconductor device 50 is formed. The gate electrode 260 includes a portion 260P that is laterally between the source/drain electrodes 250A and 250B. In some embodiments, the portion 260P does not overlap the 2-D material layers 210A and 210B, the interlayer electrodes 280A and 280B, and the interlayer electrodes 282A and 282B. In some embodiments, the 2-D material layers 210A and 210B may be omitted in the semiconductor device 50.

Figure 30:
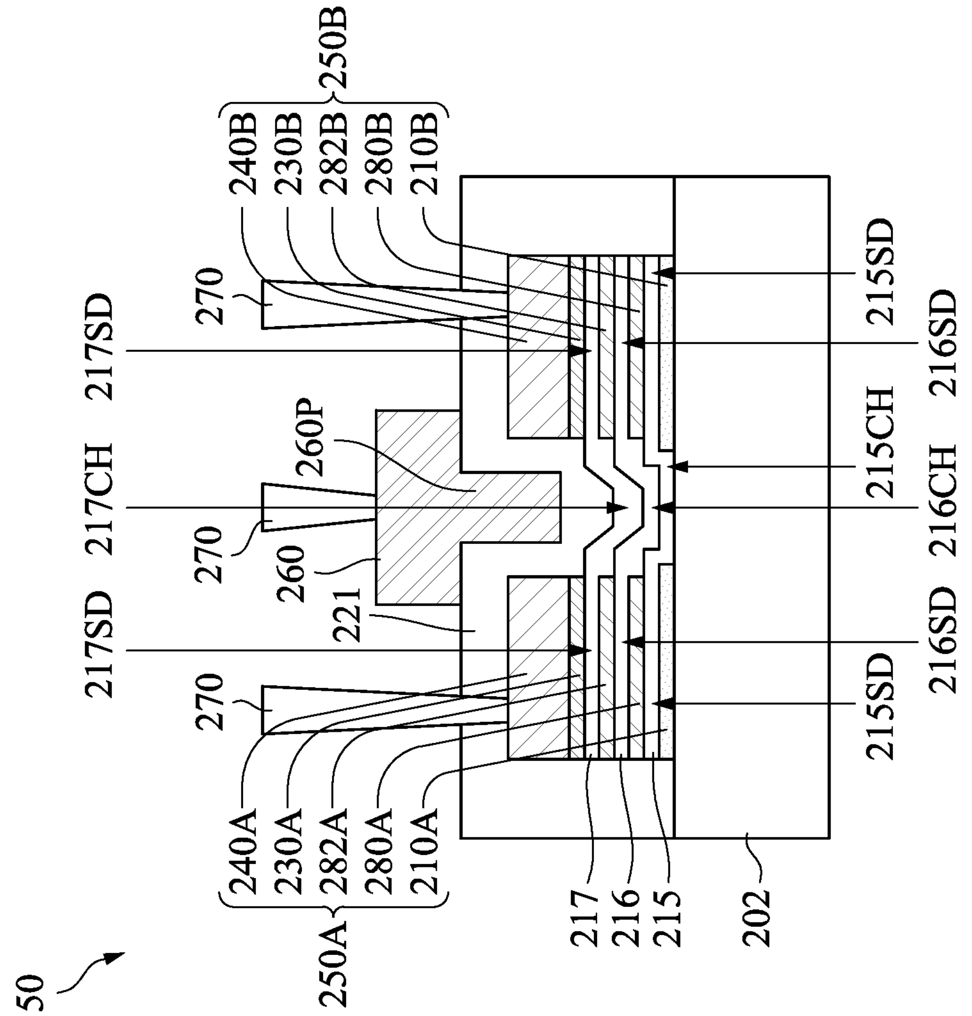

Reference is made to FIG. 30. Vias 270 are formed over the substrate 202 and in contact with the source/drain electrodes 250A and 250B and the gate electrode 260. Portions of the vias 270 that are in contact with the source/drain electrodes 250A and 250B may penetrate through the gate dielectric layer 221.

In the semiconductor device 50 shown in FIG. 29. In some embodiments, each of the 2-D material layers 215, 216, and 217 may include single monolayer 2-D material. In other embodiments, each of the 2-D material layers 215, 216, and 217 may include 2-4 monolayers of 2-D material. Since the drain current level of 2-D material transistors highly depends on the layer numbers of the 2-D material channel (e.g., 2-D material layers 215, 216, and 217), one most efficient approach to increase the drain currents of the device may be the increase of 2-D material layers. However, not all of the 2-D material monolayers will equally contribute to the drain current if the 2-D material layer is too thick (e.g., over 10 monolayers).

In some embodiments of the present disclosure, with underneath graphene electrodes discussed in FIGS. 21 and/or FIG. 29, the hybrid electrodes would help the current flow uniformly through the 2-D material channel layers and each 2-D material channel layer may efficiently contribute to the drain current level.

On the other hand, it is demonstrated that antimonene will be of low contact resistance electrodes to semiconductor 2-D materials. With this concept, it is possible to insert the contact electrodes between adjacent 2-D material layers. For example, a thin electrode (e.g., interlayer electrodes 280A/280B and 282A/282B) may be formed between adjacent 2-D material layers (e.g., 2-D material layers 215, 216, and 217). Through repeating this procedure, it is possible to achieve a multi-layer 2-D material transistor with hybrid source/drain electrodes and make each multi-layer 2-D material layer efficiently contribute to the drain currents.

Figure 31:
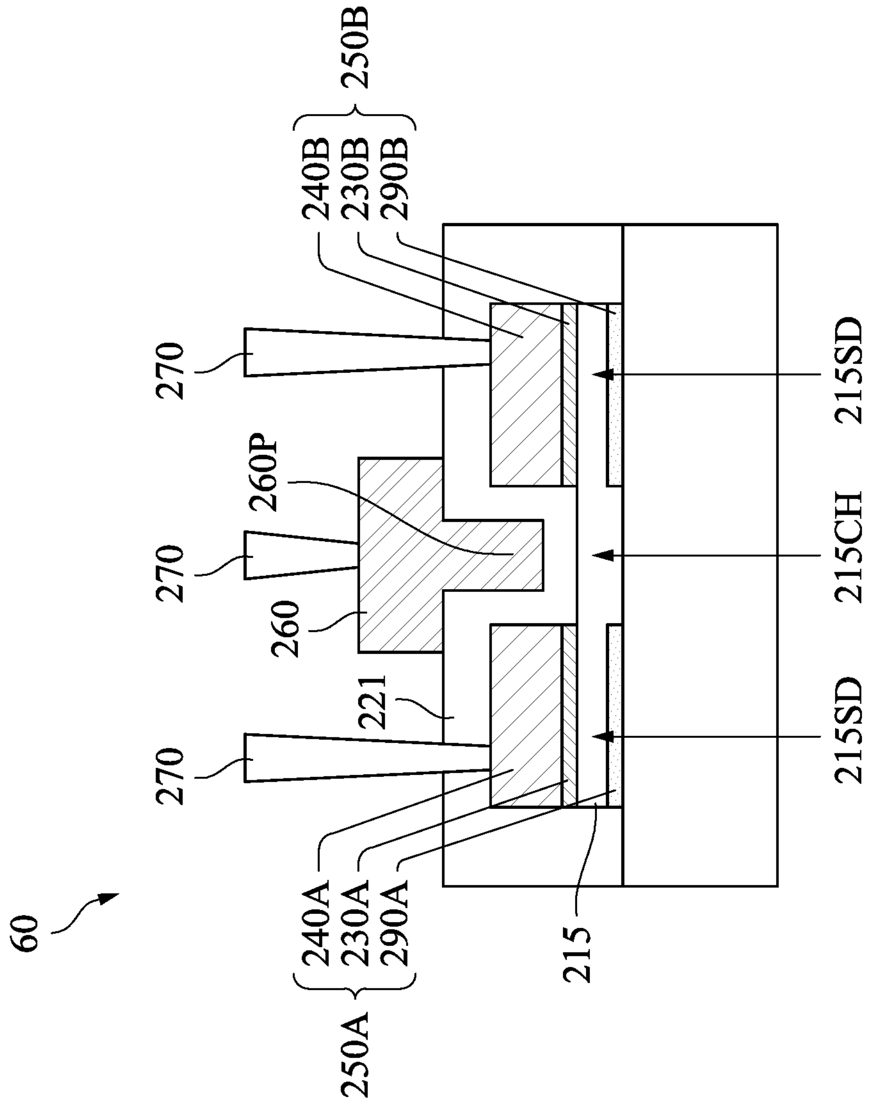
FIG. 31 illustrates a schematic view of a semiconductor device in accordance with some embodiments.

FIG. 31 illustrates a schematic view of a semiconductor device in accordance with some embodiments. Shown there is a semiconductor device 60. The semiconductor device 60 is similar to the semiconductor device 40 as discussed with respect to FIGS. 15 to 21. The semiconductor device 60 is different from the semiconductor device 40, in that the 2-D material layers 210A and 210B are replaced with electrode layers 290A and 290B, respectively.

In some embodiments, the 2-D material layer 215 may function as n-type channel layer. In such condition, metals with work function value that is smaller than the work function value of the 2-D material layer 215 may be suitable candidates as the Ohmic contact metals for n-channel transistors. In such embodiments, the electrode layers 290A and 290B may include metal such as Ge, Sn, Sb, Ag, Al, Ti and Cu.

In some embodiments, the 2-D material layer 215 may function as p-type channel layer. In such condition, metals with work function value that is larger than the work function value of the 2-D material layer 215 may be suitable candidates as the Ohmic contact metals for n-channel transistors. In such embodiments, the electrode layers 290A and 290B may include metal such as Au and Pt.

Figure 32:
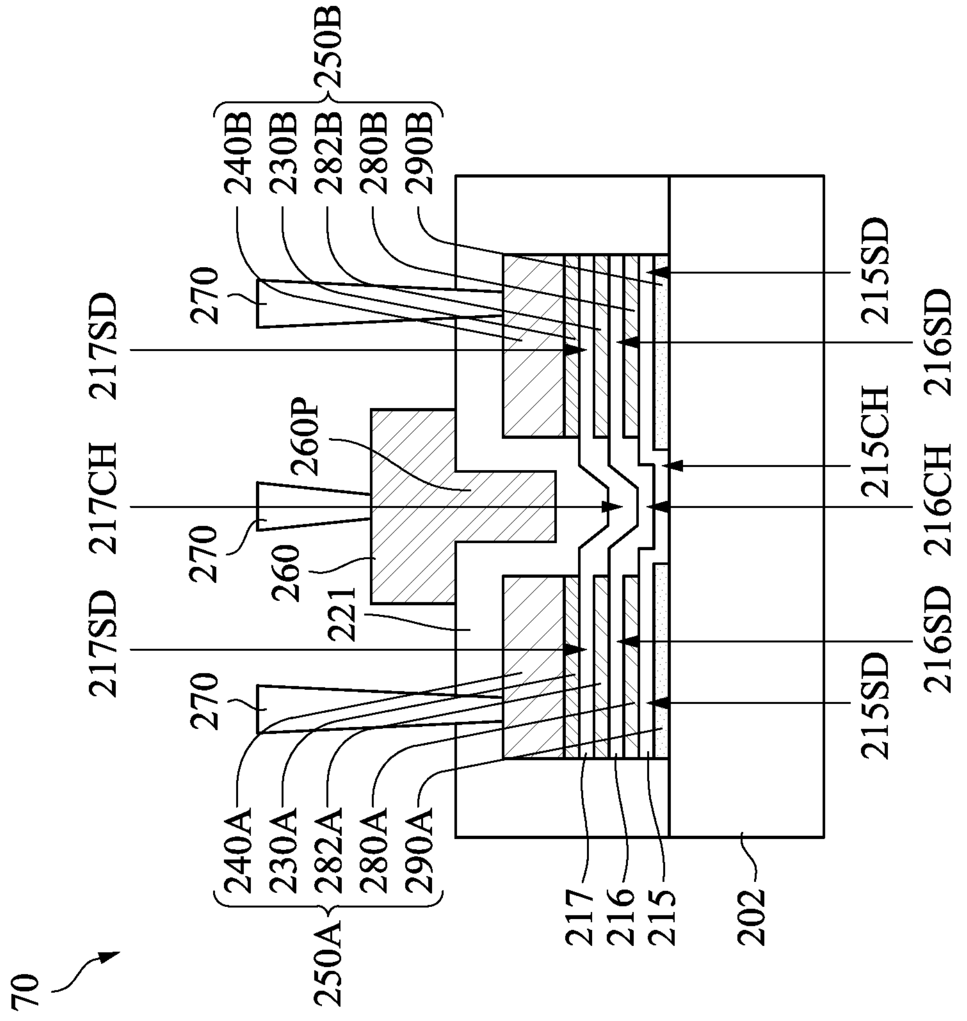
FIG. 32 illustrates a schematic view of a semiconductor device in accordance with some embodiments.

FIG. 32 illustrates a schematic view of a semiconductor device in accordance with some embodiments. Shown there is a semiconductor device 70. The semiconductor device 70 is similar to the semiconductor device 50 as discussed with respect to FIGS. 22 to 30. The semiconductor device 70 is different from the semiconductor device 50, in that the 2-D material layers 210A and 210B are replaced with electrode layers 290A and 290B, respectively.

In some embodiments, the 2-D material layers 215, 216, and 217 may function as n-type channel layer. In such embodiments, the electrode layers 290A and 290B may include metal such as Ge, Sn, Sb, Ag, Al, Ti and Cu.

In some embodiments, the 2-D material layers 215, 216, and 217 may function as p-type channel layer. In such embodiments, the electrode layers 290A and 290B may include metal such as Au and Pt.

According to the aforementioned embodiments, it can be seen that the present disclosure offers advantages in fabricating integrated circuits. It is understood, however, that other embodiments may offer additional advantages, and not all advantages are necessarily disclosed herein, and that no particular advantage is required for all embodiments. Embodiments of the present disclosure provide a 2-D material transistor with electrodes, such as graphene, underneath the 2-D material channel layer. With such configuration, significant drain current enhancement can be observed for the 2-D material transistor. Such configuration can also avoid graphene growth and selective etching of graphene on 2-D material channel layer. Moreover, embodiments of the present disclosure provide a 2-D material transistor with interlayer electrodes interposed between two adjacent 2-D material channel layers. With such configuration, it is possible make each layer of the 2-D material channel layers contribute to the drain current. As a result, the device performance may be improved.

In some embodiments of the present disclosure, a semiconductor device includes a 2-D material channel layer, a gate structure, and source/drain electrodes. The gate structure is over a channel region of the 2-D material channel layer. The source/drain electrodes are over source/drain regions of the 2-D material channel layer, respectively. Each of the source/drain electrodes includes a 2-D material electrode and a metal electrode. The 2-D material electrode is below a bottom surface of a corresponding one of the source/drain regions of the 2-D material channel layer. The metal electrode is over a top surface of the corresponding one of the source/drain regions of the 2-D material channel layer.

In some embodiments, the 2-D material electrode is made of a metal-free 2-D material.

In some embodiments, the 2-D material channel layer is made of a metal-containing 2-D material.

In some embodiments, the 2-D material channel layer is made of transition metal dichalcogenide and the 2-D material electrode is made of graphene.

In some embodiments, a bottom surface of the channel region of the 2-D material channel layer is substantially level with a bottom surface of the 2-D material electrode of each of the source/drain electrodes.

In some embodiments, the 2-D material channel layer is in contact with a sidewall and a top surface of the 2-D material electrode of each of the source/drain electrodes.

In some embodiments, the gate structure includes a gate dielectric layer and a gate electrode, in which the gate electrode includes a portion laterally between the source/drain electrodes, wherein along a vertical direction, the portion of the gate electrode non-overlaps the 2-D material electrode of each of the source/drain electrodes.

In some embodiments of the present disclosure, a semiconductor device includes a first 2-D material channel layer, a gate structure, and source/drain electrodes. The gate structure is over a channel region of the 2-D material channel layer. The source/drain electrodes are over source/drain regions of the 2-D material channel layer, respectively. Each of the source/drain electrodes includes a graphene layer and a metal layer. The graphene layer is in contact with a bottom surface of a corresponding one of the source/drain regions of the first 2-D material channel layer. The metal layer is over a top surface of the corresponding one of the source/drain regions of the first 2-D material channel layer.

In some embodiments, the semiconductor device further includes a second 2-D material channel layer over the first 2-D material channel layer.

In some embodiments, each of the source/drain electrodes further includes an interlayer electrode vertically between the first 2-D material channel layer and the second 2-D material channel layer.

In some embodiments, a channel region of the first 2-D material channel layer is in contact with a channel region of the second 2-D material layer.

In some embodiments, the first 2-D material channel layer comprises 2 to 4 monolayers of a 2-D material.

In some embodiments, the second 2-D material channel layer is in contact with a sidewall and a top surface of the interlayer electrode of each of the source/drain electrodes.

In some embodiments, a bottommost end of the second 2-D material channel layer is lower than a bottom surface of the interlayer electrode of each of the source/drain electrodes.

In some embodiments, the first 2-D material channel layer is made of transition metal dichalcogenide.

In some embodiments of the present disclosure, a method includes forming a graphene layer over a substrate; patterning the graphene layer such that the patterned graphene layer has two separated portions; forming a first 2-D material channel layer over the substrate and covering the two separated portions of the patterned graphene layer; forming metal electrodes over the source/drain regions of the first 2-D material channel layer; and forming a gate structure over a channel region of the first 2-D material channel layer.

In some embodiments, the method further includes prior to forming the metal electrodes, forming interlayer electrodes over the source/drain regions of the first 2-D material channel layer; and forming a second 2-D material channel layer over the first 2-D material channel layer and covering the interlayer electrodes.

In some embodiments, the method further includes patterning the first 2-D material channel layer and the second 2-D material channel layer prior to forming the metal electrodes.

In some embodiments, the first 2-D material channel layer is in contact with a sidewall of each of the two separated portions of the patterned graphene layer.

In some embodiments, the first 2-D material channel layer is made of transition metal dichalcogenide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a graphene layer over a substrate;
patterning the graphene layer such that the patterned graphene layer has two separated portions;
forming a first 2-D material channel layer over the substrate and covering the two separated portions of the patterned graphene layer;
forming metal electrodes over source/drain regions of the first 2-D material channel layer; and
forming a gate structure over a channel region of the first 2-D material channel layer.

2. The method of claim 1, further comprising:
prior to forming the metal electrodes, forming interlayer electrodes over the source/drain regions of the first 2-D material channel layer; and
forming a second 2-D material channel layer over the first 2-D material channel layer and covering the interlayer electrodes.

3. The method of claim 2, further comprising patterning the first 2-D material channel layer and the second 2-D material channel layer prior to forming the metal electrodes.

4. The method of claim 1, wherein the first 2-D material channel layer is in contact with a sidewall of each of the two separated portions of the patterned graphene layer.

5. The method of claim 1, wherein the first 2-D material channel layer is made of transition metal dichalcogenide.

6. A method, comprising:
forming an electrode layer over a substrate;
patterning the electrode layer to form first source/drain electrodes spaced apart from each other;
depositing a 2-D material channel layer over the first source/drain electrodes;
forming second source/drain electrodes over the 2-D material channel layer; and
forming a gate electrode over the 2-D material channel layer.

7. The method of claim 6, wherein the electrode layer is made of a 2-D material.

8. The method of claim 7, wherein the electrode layer and the 2-D material channel layer are made of different 2-D materials.

9. The method of claim 6, wherein the second source/drain electrodes vertically overlaps the first source/drain electrodes, respectively.

10. The method of claim 6, wherein the second source/drain electrodes are spaced apart from the first source/drain electrodes.

11. The method of claim 6, wherein the 2-D material channel layer interfaces with sidewalls of the first source/drain electrodes.

12. The method of claim 6, further comprising forming a gate dielectric layer covering the 2-D material channel layer, wherein the gate dielectric layer interfaces sidewalls of the first source/drain electrodes and the 2-D material channel layer.

13. A method, comprising:
forming a first 2-D material channel layer over a substrate;
forming first interlayer electrodes over source/drain regions of the first 2-D material channel layer;
forming a second 2-D material channel layer over the first 2-D material channel layer and covering the first interlayer electrodes, wherein the second 2-D material channel layer interfaces the first 2-D material channel layer; and
forming a gate electrode over the second 2-D material channel layer.

14. The method of claim 13, wherein the first interlayer electrodes are made of metal.

15. The method of claim 13, wherein the first interlayer electrodes are made of graphene.

16. The method of claim 13, further comprising forming 2-D material electrodes over the substrate, wherein the first 2-D material channel layer is formed over the 2-D material electrodes.

17. The method of claim 16, wherein the first interlayer electrodes vertically overlaps the 2-D material electrodes.

18. The method of claim 13, wherein the second 2-D material channel layer interfaces sidewalls of the first interlayer electrodes.

19. The method of claim 13, further comprising:
forming second interlayer electrodes over source/drain regions of the second 2-D material channel layer; and
forming a third 2-D material channel layer over the second 2-D material channel layer and covering the second interlayer electrodes.

20. The method of claim 13, wherein the first interlayer electrodes comprise 2-D material.

* * * * *